US012784843B2

(12) United States Patent

Shin et al.

(10) Patent No.: US 12,784,843 B2
(45) Date of Patent: Nov. 3, 2026

(54) MEMORY DEVICE CHANGING CLOCK FREQUENCY ACCORDING TO THE NUMBER OF ACTIVE BLOCKS AND STORAGE DEVICE INCLUDING THE SAME

(71) Applicant: SAMSUNG ELECTRONICS CO., LTD., Suwon-si (KR)

(72) Inventors: Seo-Hyun Shin, Suwon-si (KR); Youngcho Kim, Suwon-si (KR); Soonwon Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 133 days.

(21) Appl. No.: 18/816,597

(22) Filed: Aug. 27, 2024

(65) Prior Publication Data

US 2025/0266106 A1 Aug. 21, 2025

(30) Foreign Application Priority Data

Feb. 16, 2024 (KR) ........................ 10-2024-0022309

(51) Int. Cl.
*G11C 16/32* (2006.01)
*G11C 5/14* (2006.01)
*G11C 16/30* (2006.01)

(52) U.S. Cl.
CPC .............. *G11C 16/32* (2013.01); *G11C 5/145* (2013.01); *G11C 16/30* (2013.01)

(58) Field of Classification Search
CPC ..... G11C 16/32; G11C 16/30; G11C 16/0483; G11C 16/16; G11C 16/26; G11C 5/145; G11C 5/147; G11C 7/222; G11C 8/12
See application file for complete search history.

(56) References Cited

U.S. PATENT DOCUMENTS

| | | | |
|---|---|---|---|
| 8,351,271 B2 | 1/2013 | Honda | |
| 8,508,998 B2 | 8/2013 | Haukness | |
| 9,990,979 B2 | 6/2018 | Park | |
| 10,636,480 B2 | 4/2020 | Intrater et al. | |
| 11,901,025 B2 | 2/2024 | Cho et al. | |

(Continued)

FOREIGN PATENT DOCUMENTS

| | | |
|---|---|---|
| EP | 3295310 | 3/2018 |
| JP | 2023-141561 | 10/2023 |

(Continued)

OTHER PUBLICATIONS

Extended European Search Report in European Appln. No. 24219688.9, mailed on Apr. 4, 2025, 11 pages.

*Primary Examiner* — Sultana Begum
(74) *Attorney, Agent, or Firm* — Fish & Richardson P.C.

(57) ABSTRACT

A memory device is disclosed including a memory cell array, a voltage generator, and a control logic. The memory cell array has a plurality of active blocks, each active block including a plurality of memory cells operating at the same clock frequency. The voltage generator provides an operating voltage to the plurality of memory cells. The control logic controls an independent memory operation for each active block. The voltage generator includes a pump circuit which changes a clock frequency for generating the operating voltage according to a number of active blocks activated during the independent memory operation.

16 Claims, 17 Drawing Sheets

(56) References Cited

U.S. PATENT DOCUMENTS

| | | | | |
|---|---|---|---|---|
| 2002/0093869 | A1* | 7/2002 | Lee | G11C 8/12 365/230.03 |
| 2016/0259576 | A1* | 9/2016 | Asami | G06F 3/0659 |
| 2020/0026991 | A1 | 1/2020 | Lin et al. | |
| 2022/0255549 | A1 | 8/2022 | Moon et al. | |
| 2022/0263408 | A1* | 8/2022 | Hong | G11C 5/145 |
| 2023/0024668 | A1 | 1/2023 | Choi et al. | |
| 2023/0307018 | A1 | 9/2023 | Kataoka | |

FOREIGN PATENT DOCUMENTS

| | | |
|---|---|---|
| KR | 10-0968466 | 7/2010 |
| KR | 10-2011-0131208 | 12/2011 |
| KR | 10-1754224 | 7/2017 |
| KR | 10-2430865 | 8/2022 |
| KR | 10-2023-0051835 | 4/2023 |

* cited by examiner

MEMORY DEVICE CHANGING CLOCK FREQUENCY ACCORDING TO THE NUMBER OF ACTIVE BLOCKS AND STORAGE DEVICE INCLUDING THE SAME

CROSS-REFERENCE TO RELATED APPLICATION

This application claims priority under 35 U.S.C. § 119 to Korean Patent Application No. 10-2024-0022309 filed on Feb. 16, 2024, in the Korean Intellectual Property Office, the disclosures of which are incorporated by reference herein in their entireties.

BACKGROUND

Semiconductor memories may be classified as a volatile memory or a non-volatile memory, for example. Typically, the volatile memories (e.g., a dynamic random access memory (DRAM) or a static random access memory (SRAM)) may exhibit faster read and/or write speeds when compared to the non-volatile memory. However, data stored in the volatile memory may disappear when a power applied to the volatile memory is turned off. In contrast, the non-volatile memory may retain the data even when the power is turned off.

SUMMARY

Example implementations of the present disclosure provide a memory device that may reduce current consumption in a peripheral circuit by varying the clock frequency according to the number of active blocks to be activated, and a storage device including the same.

Example implementations of the present disclosure described herein relate to a semiconductor memory device, and more particularly, relate to a memory device whose clock frequency varies depending on the number of active blocks to be activated, and a storage device including the same.

A representative example of a non-volatile memory may be a flash memory. The flash memory may store multi-bit data of two or more bits in one memory cell. The flash memory may have at least one erase state and a plurality of program (e.g., writing) states depending on threshold voltage distributions.

A memory cell array of the flash memory may include a plurality of memory blocks. Each memory block may include a plurality of memory cells. The flash memory may provide operating voltage to the word line during operations such as program, read, and erase. The flash memory may generate an operating voltage using clock signals from a pump circuit.

The flash memory may generate an operating voltage using clock signals with one clock frequency. The flash memory may consume a lot of current in peripheral circuit. For example, the clock frequency is set considering the maximum number of memory blocks that are activated simultaneously, but if only some of the memory blocks are activated, excessive current may be consumed unnecessarily.

According to implementations, a memory device comprises, a memory cell array having a plurality of active blocks, each active block including a plurality of memory cells operating at the same clock frequency; a voltage generator configured to provide an operating voltage to the plurality of memory cells; and a control logic configured to control an independent memory operation for each active block. Wherein the voltage generator includes a pump circuit configured to change a clock frequency for generating the operating voltage according to the number of active blocks activated during the independent memory operation.

According to implementations, a memory device comprising, a first stack in which first memory cells are stacked in a direction perpendicular to a substrate; and a second stack in which second memory cells are stacked on the first stack in a direction perpendicular to the substrate. Wherein the first and second memory cells are divided into a plurality of active blocks operating at the same clock frequency. Wherein the memory device performs independent memory operations for each active block, and changes clock frequencies for performing the independent memory operation according to the number of active blocks activated during the independent memory operation.

According to implementations, an operating method of a memory device which includes a memory cell array having a plurality of active blocks, each active block including a plurality of memory cells; a voltage generator configured to provide an operating voltage to the plurality of memory cells; and a control logic configured to control independent memory operations for each active block, the method comprising: counting the number of active blocks activated during the independent memory operation; changing the frequency of clock signals for generating the operating voltage according to the counted number of active blocks; and providing clock signals with changed frequencies to the voltage generator.

BRIEF DESCRIPTION OF THE DRAWINGS

The above and other objects and features of the present disclosure will become apparent by describing in detail implementations thereof with reference to the accompanying drawings.

DETAILED DESCRIPTION

Below, example implementations of the present disclosure will be described in detail and clearly to such an extent that one of ordinary skill in the art easily may implement them.

Figure 1:
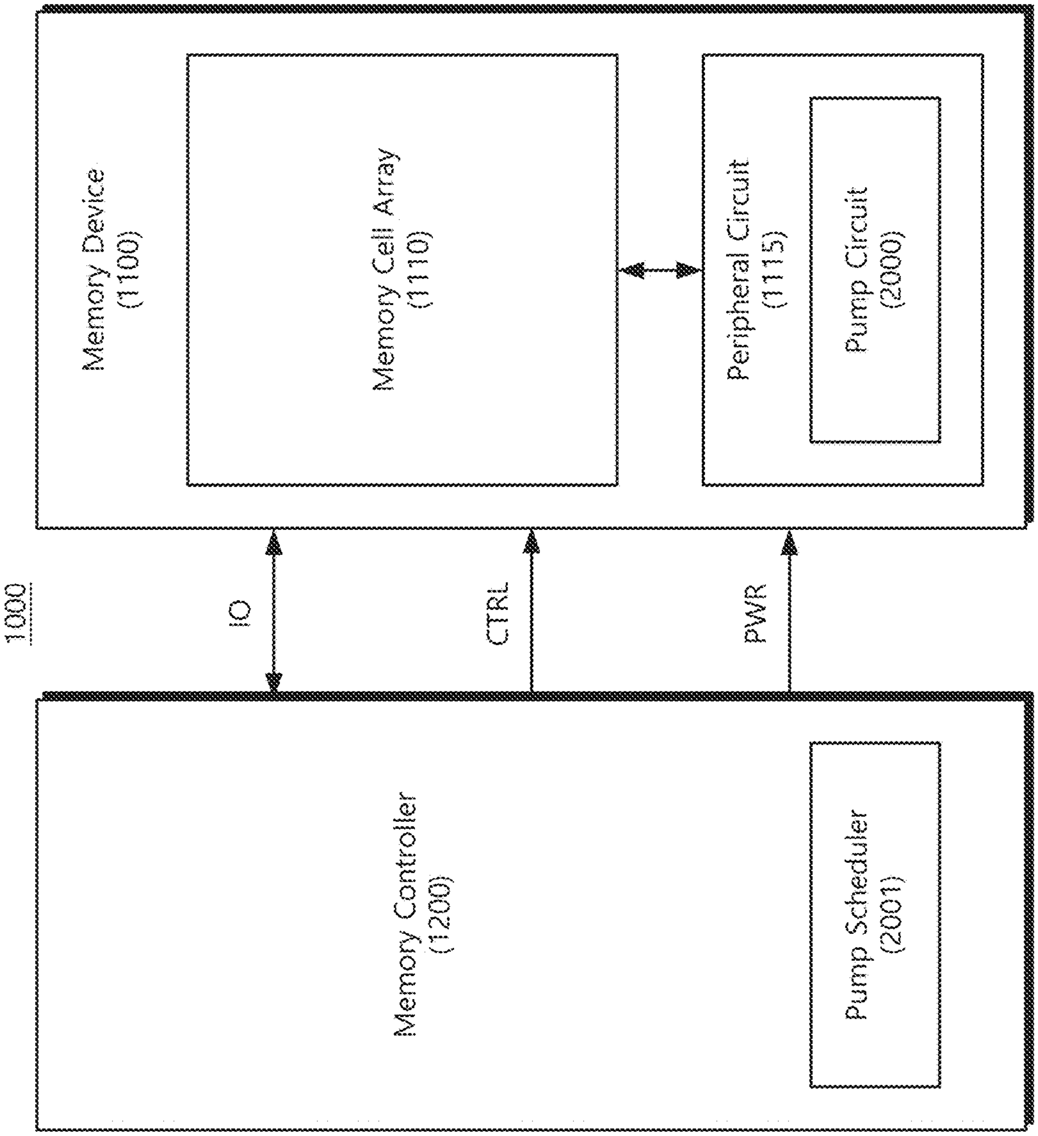
FIG. 1 is a block diagram illustrating an example implementation of a storage device according to the present disclosure.

FIG. 1 is a block diagram illustrating an example implementation of a storage device according to the present disclosure. The storage device 1000 may be a flash storage device based on a flash memory. For example, the storage device 1000 may be implemented as a solid-state drive (SSD), a universal flash storage (UFS), a memory card, or the like.

Referring to FIG. 1, the storage device 1000 may include a memory device 1100 and a memory controller 1200. The memory device 1100 may receive input/output signals IO from the memory controller 1200 through input/output lines, receive control signals CTRL through control lines, and receive external power supply PWR through power lines. The storage device 1000 may store data in the memory device 1100 under the control of the memory controller 1200.

The memory device 1100 may include a memory cell array 1110 and a peripheral circuit 1115. The memory cell array 1110 may have a vertical 3D structure. The memory cell array 1110 may include a plurality of memory cells. Multi-bit data may be stored in each memory cell.

The memory cell array 1110 may be located (e.g., disposed) next to or above the peripheral circuit 1115 in terms of the design layout structure. A structure in which the memory cell array 1110 is positioned over the peripheral circuit 1115 may be referred to as a cell on peripheral (COP) structure.

The memory cell array 1110 may be manufactured as a chip separate from the peripheral circuit 1115. An upper chip including the memory cell array 1110 and a lower chip including the peripheral circuit 1115 may be connected to each other by a bonding method. Such a structure may be referred to as a chip-to-chip (C2C) structure.

The peripheral circuit 1115 may include analog circuits and/or digital circuits required to store data in the memory cell array 1110 or read data stored in the memory cell array 1110. The peripheral circuit 1115 may receive the external power PWR through power lines and generate internal powers of various levels.

The peripheral circuit 1115 may receive commands, addresses, and/or data from the memory controller 1200 through input/output lines. The peripheral circuit 1115 may store data in the memory cell array 1110 according to the control signals CTRL. Alternatively or additionally, the peripheral circuit 1115 may read data stored in the memory cell array 1110 and provide the read data to the memory controller 1200.

The peripheral circuit 1115 may include a pump circuit 2000. The pump circuit 2000 may include a plurality of stage pumps. The pump circuit 2000 may generate a desired operating voltage by sequentially operating the plurality of stage pumps from the output terminal according to clock signals.

The memory controller 1200 may include a pump scheduler 2001. The pump scheduler 2001 may include a command queue and may calculate the amount of operating current required to drive the memory device 1100 based on commands stored in the command queue. The pump scheduler 2001 may compare the operating current amount and the threshold current amount and change the clock frequency of clock signals generated in the pump circuit 2000 according to the comparison result.

Figure 2:
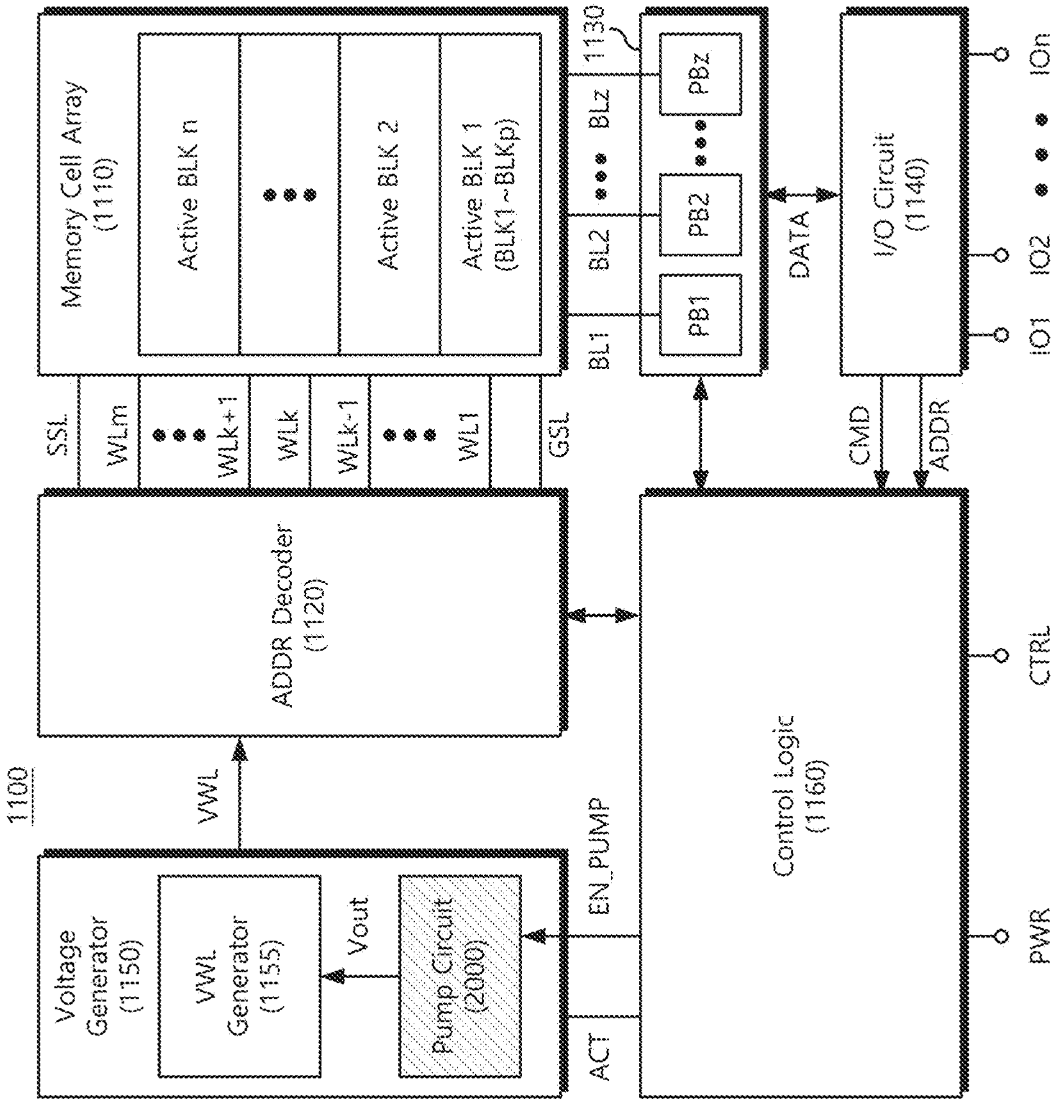
FIG. 2 is a block diagram illustrating an example implementation of the memory device illustrated in FIG. 1.

FIG. 2 is a block diagram illustrating an example implementation of the memory device illustrated in FIG. 1. Referring to FIG. 2, the memory device 1100 may include the memory cell array 1110 and the peripheral circuit 1115 (see FIG. 1). The peripheral circuit 1115 may include an address decoder 1120, a page buffer circuit 1130, ana input/output circuit 1140, a voltage generator 1150, and a control logic 1160.

The memory cell array 1110 may include a plurality of active blocks (Active BLK1 to BLKn). Here, the active block refers to a group of memory cells operating at the same clock frequency. For example, the active block may be a mat or a plane that is separated in the layout structure of the memory cell array 1110.

Each active block may include a plurality of memory blocks. For example, the first active block (Active BLK1) may include first to p-th memory blocks (BLK1 to BLKp). Each memory block may include a plurality of pages. Each page may include a plurality of memory cells. Each memory cell may store multi-bit data (e.g., two or more bits). Each memory block may correspond to an erase unit, and each page may correspond to a read unit and/or a write unit.

The memory cell array 1110 may be formed in a direction perpendicular to a substrate. A gate electrode layer and an insulation layer may be alternately deposited on the substrate. Each memory block (e.g., BLK1) may be connected to one or more string selection lines SSL, a plurality of word lines WL1 to WLm, and one or more ground selection lines GSL. WLk is a selected word line sWL and the remaining word lines (WL1 to WLk−1, WLk+1 to WLm) are unselected word lines uWL.

The address decoder 1120 may be connected to the memory cell array 1110 through selection lines SSL and GSL and word lines WL1 to WLm. The address decoder 1120 may select a word line during a program or read operation. The address decoder 1120 may receive the word line voltage VWL from the word line voltage generator 1150 and provide a program voltage or read voltage to the selected word line.

The page buffer circuit 1130 may be connected to the memory cell array 1110 through bit lines BL1 to BLz. The page buffer circuit 1130 may temporarily store data to be stored in the memory cell array 1110 or data read from the memory cell array 1110. The page buffer circuit 1130 may include page buffers PB1 to PBz connected to respective bit lines. Each page buffer may include a plurality of latches to store or read multi-bit data.

The input/output circuit 1140 may be internally connected to the page buffer circuit 1130 through data lines and externally connected to the memory controller 1200 (refer to FIG. 1) through the input/output lines IO1 to IOn. The input/output circuit 1140 may receive program data from the memory controller 1200 during a program operation. Also, the input/output circuit 1140 may provide data read from the memory cell array 1110 to the memory controller 1200 during a read operation.

The voltage generator 1150 may receive internal power from the control logic 1160 and generate a word line voltage VWL required to read or write data. The word line voltage VWL may be provided to a selected word line (sWL) or unselected word lines (uWL) through the address decoder 1120.

The voltage generator 1150 may include a word line voltage generator 1155. The word line voltage generator 1150 may include a program voltage generator and a pass voltage generator. The program voltage generator may generate a program voltage Vpgm provided to the selected word line during a program operation. The pass voltage generator may generate a pass voltage Vpass provided to the selected word line and the unselected word lines.

The word line voltage generator 1155 may include a read voltage generator and a read pass voltage generator. The read voltage generator may generate a selected read voltage provided to the selected word line during a read operation. The read pass voltage generator may generate a read pass voltage provided to the unselected word lines. The read pass voltage may be a voltage sufficient to turn on memory cells connected to the unselected word lines during a read operation.

The voltage generator 1150 may further include a pump circuit 2000. The pump circuit 2000 may operate by receiving a pump enable signal (EN_PUMP) from the control logic 1160. The pump circuit 2000 may receive a power supply voltage and provide an output voltage (Vout) to the word line voltage generator 1155. The pump circuit 2000 may change the clock frequency of clock signals for generating the output voltage Vout according to the number of active blocks activated during the operation of the memory device 1100.

The control logic 1160 may control operations such as read, write, and erase of the memory device 1100 using commands CMD, addresses ADDR, and control signals CTRL provided from the memory controller 1200. The control logic 1160 may provide the active block use signal (ACT) and the pump enable signal (EN_PUMP) to the pump circuit 2000. The control logic 1160 may generate operating voltages required for read, write, and erase operations.

The control logic 1160 may be configured to control independent memory operations for each active block. Here, the independent memory operation may be an independent read operation, an independent program operation, or an independent erase operation performed for each active block. Independent read operation may be an operation that supports independent read operations for each active block to provide high read performance. The pump circuit 2000 may change the clock frequency of clock signals for generating an operating voltage according to the number of active blocks activated during an independent read operation.

Figure 3:
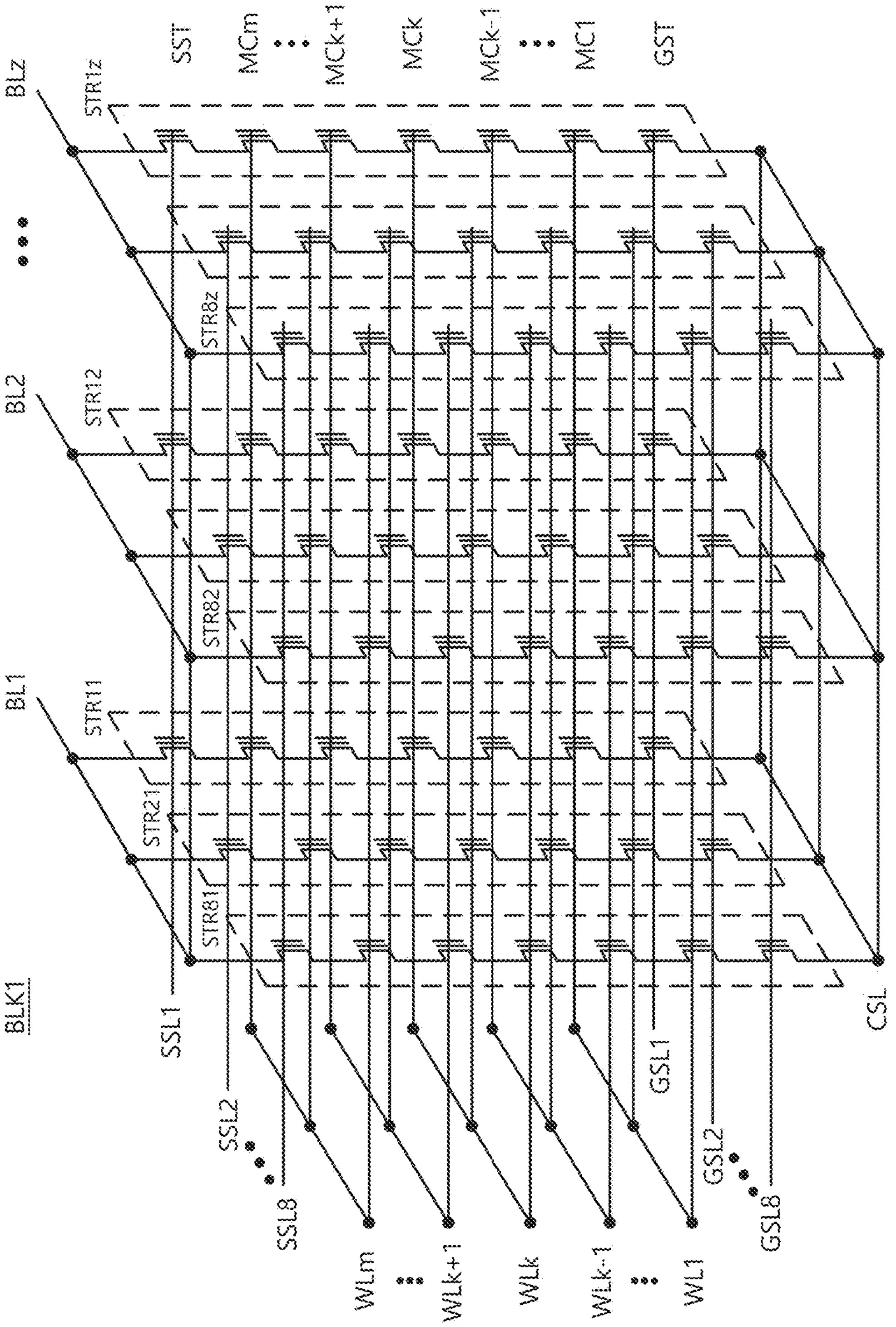
FIG. 3 is a circuit diagram illustrating an example implementation of a memory block BLK1 of the memory cell array illustrated in FIG. 2.

FIG. 3 is a circuit diagram illustrating an example implementation of a memory block BLK1 of the memory cell array illustrated in FIG. 2. Referring to FIG. 3, in the memory block BLK1, a plurality of cell strings STR11 to STR8*z* may be formed between the bit lines BL1 to BLz and a common source line CSL. Each cell string includes a string selection transistor SST, a plurality of memory cells MC1 to MCm, and a ground selection transistor GST.

The string selection transistors SST may be connected with string selection lines SSL1 to SSL8. The ground selection transistors GST may be connected with ground selection lines GSL1 to GSL8. The string selection transistors SST may be connected with the bit lines BL1 to BLz, and the ground selection transistors GST may be connected with the common source line CSL.

The first to m-th word lines WL1 to WLm may be connected with the plurality of memory cells MC1 to MCm in a row direction. The first to z-th bit lines BL1 to BLz may be connected with the plurality of memory cells MC1 to MCm in a column direction. First to z-th page buffers PB1 to PBz may be connected with the first to z-th bit lines BL1 to BLz.

The first word line WL1 may be placed above the first to eighth ground selection lines GSL1 to GSL8. The first memory cells MC1 that are placed at the same height from the substrate may be connected with the first word line WL1. The m-th word line WLm may be located below the first to eighth string selection lines SSL1 to SSL8. The m-th memory cells MCm located at the same height from the substrate may be connected to the m-th word line WLm. In a similar manner, the second to (m−1)-th memory cells MC2 to MCm−1 that are placed at the same heights from the substrate may be respectively connected with the second to (m−1)-th word lines WL2 to WLm−1, respectively.

Figure 4:
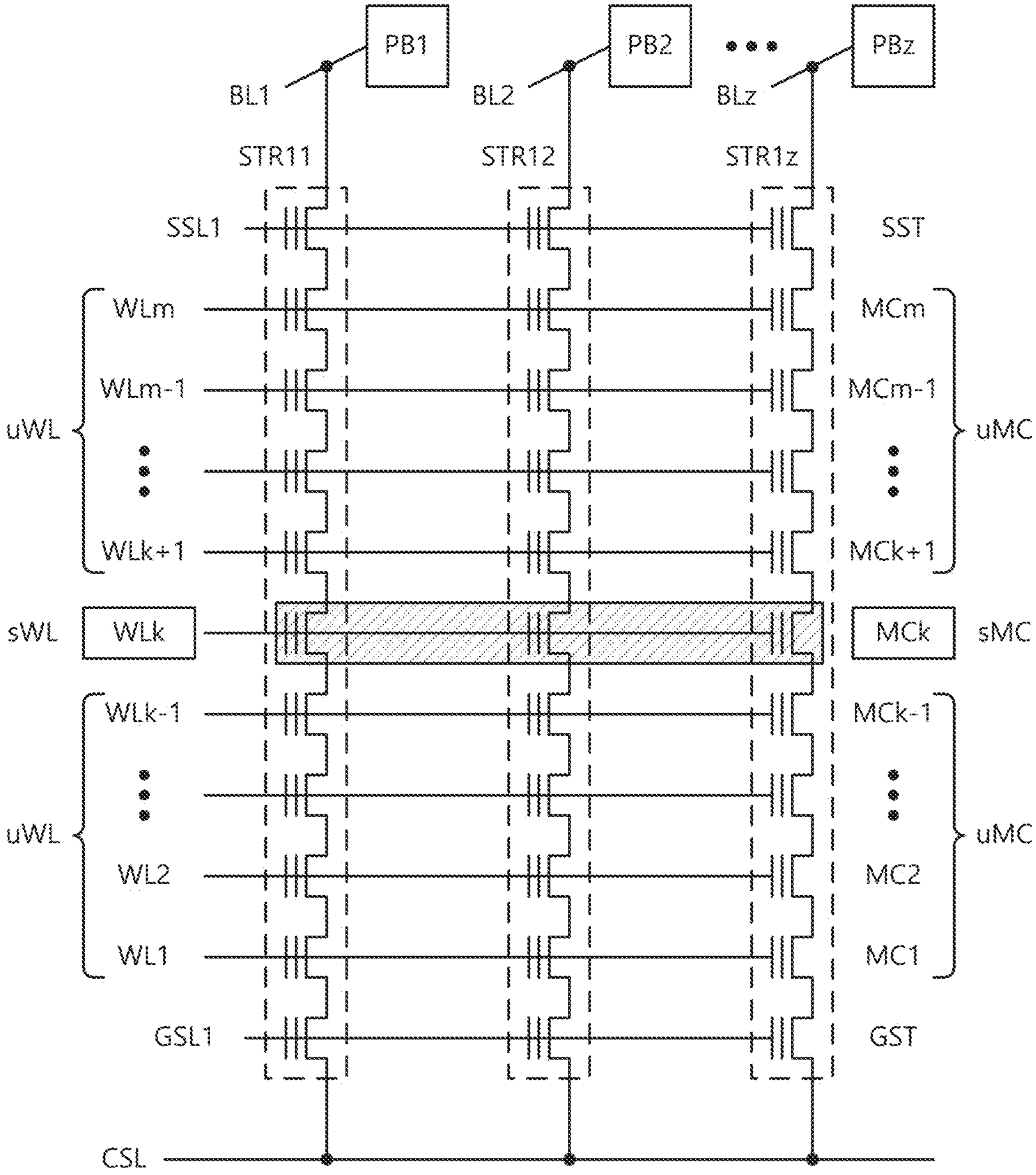
FIG. 4 is a circuit diagram illustrating cell strings selected by the first string selection line SSL1 from among the cell strings of the memory block BLK1 illustrated in FIG. 3.

FIG. 4 is a circuit diagram illustrating cell strings selected by the first string selection line SSL1 from among the cell strings of the memory block BLK1 illustrated in FIG. 3. The 11th to 1z-th cell strings STR11 to STR1*z* may be selected by the first string selection line SSL1. The eleventh to 1z-th cell strings STR11 to STR1*z* may be connected to the first to z-th bit lines BL1 to BLz, respectively. The first to z-th page buffers PB1 to PBz may be connected to the first to z-th bit lines BL1 to BLz, respectively.

The eleventh cell string STR11 may be connected to the first bit line BL1 and the common source line CSL. The eleventh cell string STR11 may include string selection transistors SST selected by the first string selection line SSL1, first to m-th memory cells MC1 to MCm connected to the first to m-th word lines WL1 to WLm, and ground selection transistors GST selected by the first ground selection line GSL1. The twelfth cell string STR12 may be connected to the second bit line BL2 and the common source line CSL. The 1z cell string STR1*z* may be connected to the z-th bit line BLz and the common source line CSL.

The first word line WL1 and the m-th word line WLm may be edge word lines (edge WL). The second word line WL2 and the (m−1)-th word line WLm−1 may be edge adjacent word lines. The k-th word line WLk may be a selected word line sWL. The (k−1)-th word line WLk−1 and the (k+1)-th word line WLk+1 may be adjacent word lines adjacent to the selected word line. If the k-th word line WLk is the selected word line sWL, the remaining word lines WL1 to WLk−1 and WLk+1 to WLm may be unselected word lines uWL.

The first memory cells MC1 and the m-th memory cells MCm may be edge memory cells. The second memory cells MC2 and the (m−1)-th memory cells MCm−1 may be edge adjacent memory cells. The k-th memory cells MCk may be selected memory cells sMC. The (k−1)-th memory cells MCk−1 and the (k+1)-th memory cells MCk+1 may be memory cells adjacent to the selected memory cells (adjacent MC). If the k-th memory cells MCk are selected memory cells sMC, the remaining memory cells MC1 to MCk−1 and MCk+1 to MCm may be unselected memory cells uMC.

A set of memory cells selected by one string selection line and connected to one word line may be one page. For example, memory cells selected by the first string selection line SSL1 and connected to the k-th word line WLk may be one page. For example, eight pages may be configured on the k-th word line WLk. Among the eight pages, a page connected to the first string selection line SSL1 is a selected page, and pages connected to the second to eighth string selection lines SSL2 to SSL8 are unselected pages.

Figure 5:
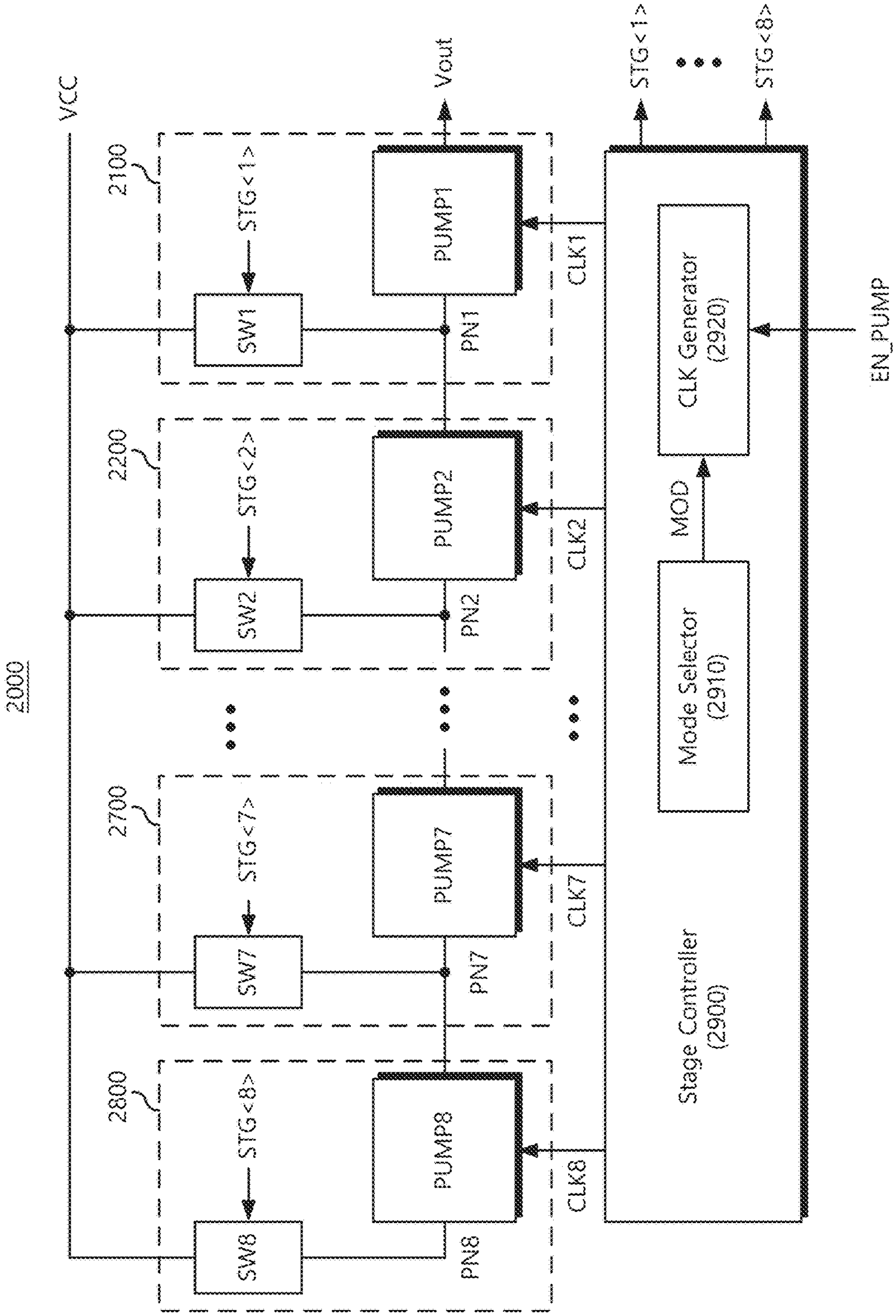
FIG. 5 is a block diagram illustrating a pump circuit illustrated in FIG. 2.

FIG. 5 is a block diagram illustrating a pump circuit illustrated in FIG. 2. Referring to FIG. 5, the pump circuit 2000 may include first to eighth stage pumps 2100 to 2800 and a stage controller 2900. The stage controller 2900 may include a mode selector 2910 and a clock generator 2920.

The clock generator 2920 may receive a mode signal (MOD) from the mode selector 2910 and a pump enable signal (EN_PUMP) from the control logic 1160. The clock generator 2920 may receive the mode signal (MOD) and the pump enable signal (EN_PUMP), and generate first to eighth stage signals (STG<1> to STG<8>) and/or first to eighth clock signals (CLK1 to CLK8). The first to eighth stage pumps 2100 to 2800 may generate the output voltage Vout in response to stage signals and/or clock signals from the stage controller 2900.

The pump circuit 2000 may drive pump stages sequentially in the order from the first stage pump 2100 to the 8-th stage pump 2800. That is, first, the first stage pump 2100 may operate in response to a first clock signal CLK1. Next, the second stage pump 2200 may operate in response to a second clock signal CLK2. As in the above description, the seventh stage pump 2700 may operate in response to the seventh clock signal CLK7. And finally, the eighth stage pump 2800 may operate in response to the eighth clock signal CLK8. Here, the first to eighth clock signals CLK1 to CLK8 may be one clock signal having the same frequency. That is, one clock signal may be provided simultaneously to the first to eighth pump circuits (PUMP1 to PUMP8).

The pump circuit 2000 may generate the output voltage Vout of a first level by using the first stage pump 2100. The first stage pump 2100 may include a first switch circuit SW1 and a first pump circuit PUMP1. The first switch circuit SW1 may provide the power supply voltage VCC to a first pump node PN1 in response to a first stage signal STG1. The first pump circuit PUMP1 may receive the first clock signal CLK1 and may generate the output voltage Vout by using a first pump node power.

The pump circuit 2000 may generate the output voltage Vout of a second level by using the first and second stage pumps 2100 and 2200. A second switch circuit SW2 of the second stage pump 2200 may provide the power supply voltage VCC to a second pump node PN2 in response to a second stage signal STG2. The second pump circuit PUMP2 may receive the second clock signal CLK2 and may generate the first pump node power by using a second pump node power. The first stage pump 2100 may generate the output voltage Vout of the second level by using the first pump node power.

As in the above description, the pump circuit 2000 may generate the output voltage Vout of an eighth level by using the first to eighth stage pumps 2100 to 2800. An eighth switch circuit SW8 of the eighth stage pump 2800 may provide the power supply voltage VCC to an eighth pump node PN8 in response to an eighth stage signal STG8. The eighth pump circuit PUMP8 may receive the eighth clock signal CLK8 and may generate a seventh pump node power by using an eighth pump node power.

The seventh stage pump 2700 may receive the seventh clock signal CLK7 and may generate a sixth pump node power by using the seventh pump node power. As in the above description, the second stage pump 2200 may generate the first pump node power by using the second pump node power. The first stage pump 2100 may generate the output voltage Vout of the eighth level by using the first pump node power.

The pump circuit 2000 may not necessarily start the driving operation from the first stage pump 2100. In some cases, the pump circuit 2000 may start the driving operation from the second to eighth stage pumps. For example, the pump circuit 2000 may start the driving operation from the fourth stage pump.

Figure 6:
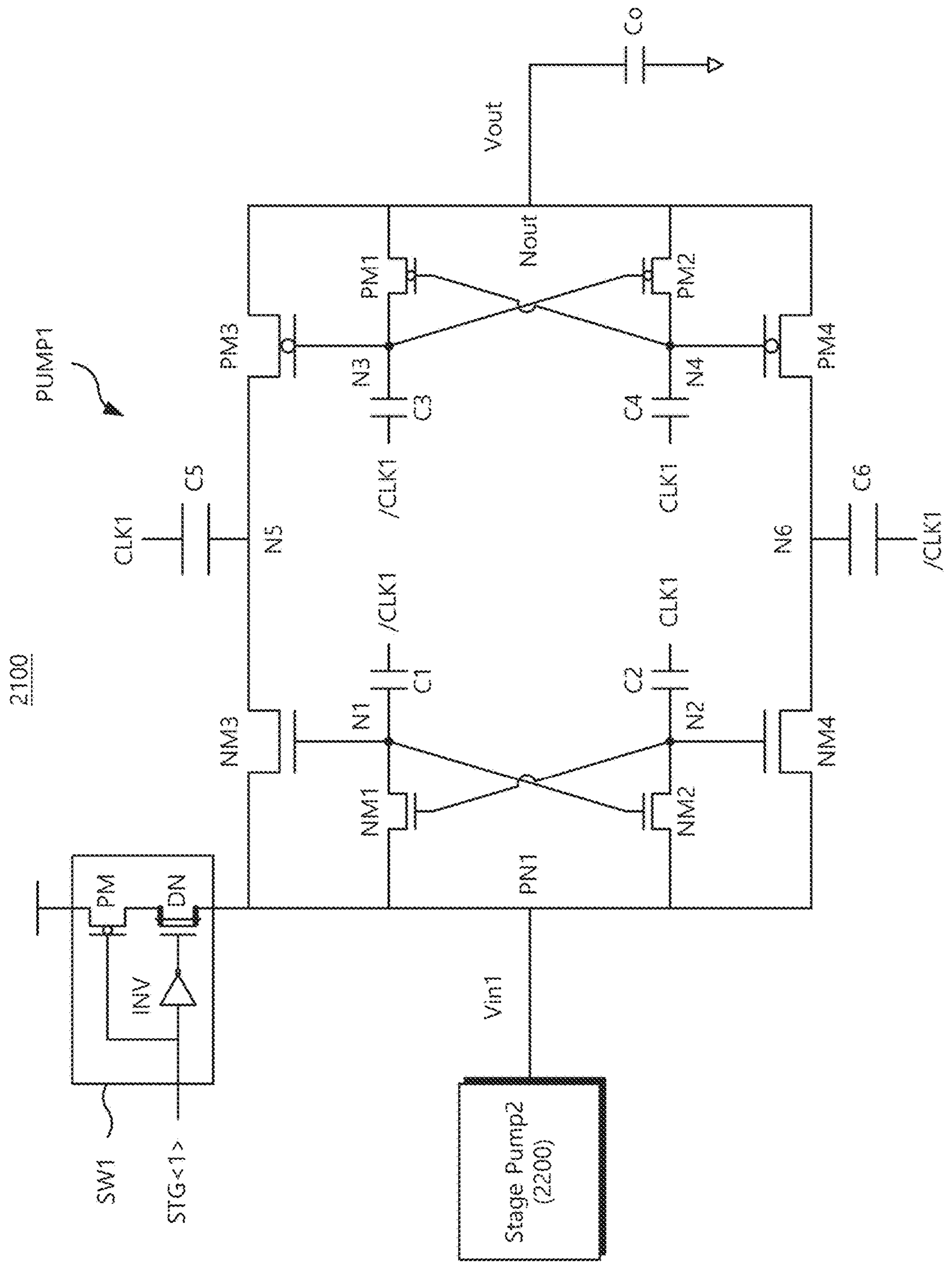
FIG. 6 is a circuit diagram illustrating a first stage pump illustrated in FIG. 5.

FIG. 6 is a circuit diagram illustrating a first stage pump illustrated in FIG. 5. Referring to FIG. 6, the first stage pump 2100 may include the first switch circuit SW1 and the first pump circuit PUMP1.

The first switch circuit SW1 may include a PMOS transistor PM and a depletion NMOS transistor DN connected between a power terminal and the first pump node PN1. An inverter INV may be connected with a gate of the depletion NMOS transistor DN. The first stage signal STG<1> may be input to a gate of the PMOS transistor PM and an input terminal of the inverter INV. When the first stage signal STG<1> is at the low level, the power supply voltage VCC may be provided to the first pump circuit PUMP1 through the first switch circuit SW1.

The first pump circuit PUMP1 may include a plurality of transistors and a plurality of capacitors. A first NMOS transistor NM1 may be connected between the first pump node PN1 of the first pump circuit PUMP1 and a first node N1. A second NMOS transistor NM2 may be connected between the first pump node PN1 and a second node N2. A first capacitor C1 may be connected with the first node N1, and the first complementary clock signal/CLK1 may be input thereto. A second capacitor C2 may be connected with the second node N2, and the first clock signal CLK1 may be input thereto. A gate of the first NMOS transistor NM1 may be connected with the second node N2, and a gate of the second NMOS transistor NM2 may be connected with the first node N1.

A first PMOS transistor PM1 may be connected between an output terminal Nout of the first pump circuit PUMP1 and a third node N3. A second PMOS transistor PM2 may be connected between the output terminal Nout and a fourth node N4. A third capacitor C3 may be connected with the third node N3, and the first complementary clock signal/CLK1 may be input thereto. A fourth capacitor C4 may be connected with the fourth node N4, and the first clock signal CLK1 may be input thereto. A gate of the first PMOS transistor PM1 may be connected with the fourth node N4, and a gate of the second PMOS transistor PM2 may be connected with the third node N3.

A third NMOS transistor NM3 may be connected between the first pump node PN1 of the first pump circuit PUMP1 and a fifth node N5. A fourth NMOS transistor NM4 may be connected between the first pump node PN1 and a sixth node N6. A fifth capacitor C5 may be connected with the fifth node N5, and the first clock signal CLK1 may be input thereto. A sixth capacitor C6 may be connected with the sixth node N6, and the first complementary clock signal/CLK1 may be input thereto. A gate of the third NMOS transistor NM3 may be connected with the first node N1, and a gate of the fourth NMOS transistor NM4 may be connected with the second node N2.

A third PMOS transistor PM3 may be connected between the output terminal Nout of the first pump circuit PUMP1 and the fifth node N5. A fourth PMOS transistor PM4 may be connected between the output terminal Nout and the sixth node N6. A gate of the third PMOS transistor PM3 may be connected with the third node N3, and a gate of the fourth PMOS transistor PM4 may be connected with the fourth node N4.

When the first clock signal CLK1 of the high level and the first complementary clock signal /CLK1 of the low level are received, the first NMOS transistor NM1 and the fourth NMOS transistor NM4 are turned on, and the second NMOS transistor NM2 and the third NMOS transistor NM3 are turned off. Also, the first PMOS transistor PM1 and the fourth PMOS transistor PM4 are turned off, and the second PMOS transistor PM2 and the third PMOS transistor PM3 are turned on.

A charge path of the first pump circuit PUMP1 may be formed through the fourth NMOS transistor NM4 and the third PMOS transistor PM3. Charges of the first pump node PN1 may be transferred to the sixth node N6 through the fourth NMOS transistor NM4. In this case, a voltage level of the sixth node N6 may be "L" (Vin1). Charges of the fifth node N5 may be transferred to the output terminal Nout through the third PMOS transistor PM3, and the voltage at the output terminal Nout may increase. Also, the charge sharing may occur between the fourth capacitor C4, the fifth capacitor C5, and an output capacitor Co. In this case, voltage levels of the fourth node N4 and the fifth node N5 may be "H" (Vout).

When the first clock signal CLK1 of the low level and the first complementary clock signal /CLK1 of the high level are received, the first NMOS transistor NM1 and the fourth NMOS transistor NM4 are turned off, and the second NMOS transistor NM2 and the third NMOS transistor NM3 are turned on. Also, the first PMOS transistor PM1 and the fourth PMOS transistor PM4 are turned on, and the second PMOS transistor PM2 and the third PMOS transistor PM3 are turned off.

A charge path of the first pump circuit PUMP1 may be formed through the third NMOS transistor NM3 and the fourth PMOS transistor PM4. Charges of the first pump node PN1 may be transferred to the fifth node N5 through the third NMOS transistor NM3. In this case, a voltage level of the fifth node N5 may be "L" (Vin1). Charges of the sixth node N6 may be transferred to the output terminal Nout through the fourth PMOS transistor PM4, and the voltage at the output terminal Nout may increase. Also, the charge sharing may occur between the third capacitor C3, the sixth capacitor C6, and the output capacitor Co. In this case, voltage levels of the third node N3 and the sixth node N6 may be "H" (Vout).

The first stage pump 2100 may generate the output voltage Vout in this manner. The output voltage Vout may correspond to "Vin1+Vclk". Herein, Vin1 may be a first pump node voltage, and Vclk may be a voltage increased by the first pump circuit PUMP1.

Figure 7:
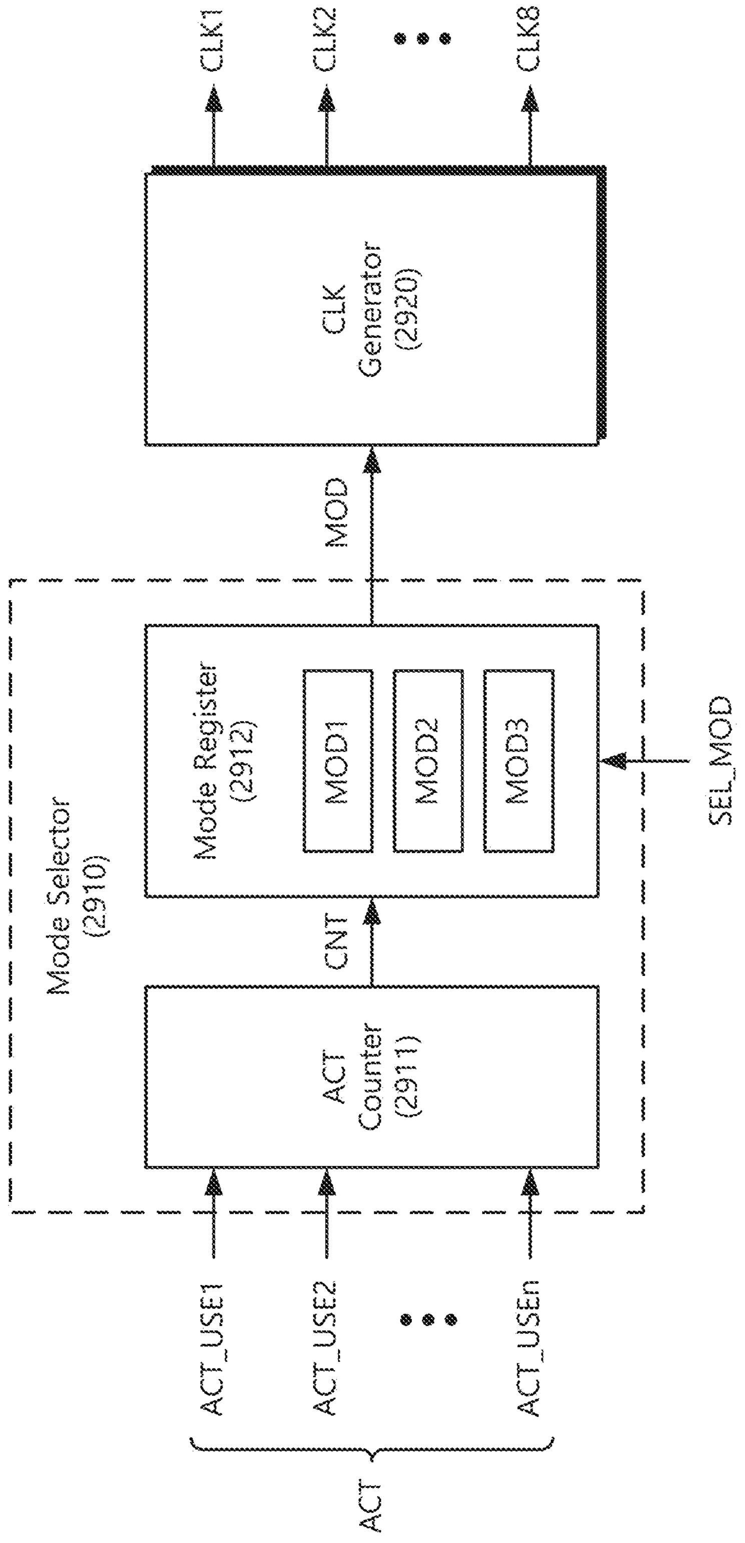
FIG. 7 is a block diagram illustrating an example implementation of the mode selector shown in FIG. 5.

FIG. 7 is a block diagram illustrating an example implementation of the mode selector shown in FIG. 5. Referring to FIG. 7, the mode selector 2910 may include an active block counter 2911 and a mode register 2912.

The active block counter 2911 may receive first to n-th active block use signals (ACT_USEi; i=1 to n) and calculate the number of active blocks in use. The active block counter 2911 may calculate the number of active blocks in use and provide a count signal CNT to the mode register 2912.

The mode register 2912 may include multiple modes. For example, the mode register 2912 may include first to third modes (MOD1 to MOD3). The mode register 2912 may select any one of the first to third modes (MOD1 to MOD3) in response to the mode selection signal SEL_MOD and provide the selected mode signal MOD to the clock generator 2920.

The mode selection signal SEL_MOD may be provided from the control logic 1160 (see FIG. 2) of the memory device 1100. When the memory device 1100 is booted, the boot code for the mode selection signal stored in the memory cell array 1110 may be uploaded to the control logic 1160. The mode selector 2910 may receive the mode selection signal SEL_MOD provided from the control logic 1160 and select one of the first to third modes (MOD1 to MOD3).

The clock generator 2920 may receive a mode signal MOD and change the clock frequencies of the first to eighth clock signals (CLK1 to CLK8). The clock generator 2920 may provide the changed clock signals (CLK1 to CLK8) to the first to eighth pump circuits (PUMP1 to PUMP8).

Figure 8:
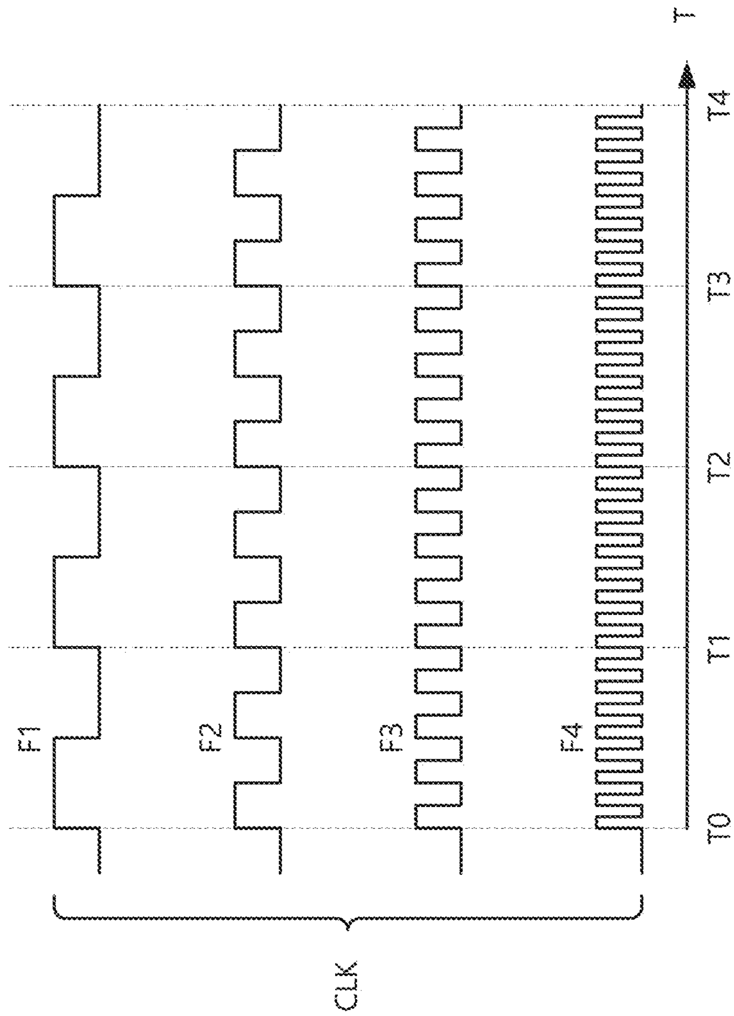
FIG. 8 is a timing diagram illustrating an example implementation of the clock frequency of the clock generator shown in FIG. 7.

FIG. 8 is a timing diagram illustrating an example implementation of the clock frequency of the clock generator shown in FIG. 7. Referring to FIG. 8, the first to eighth clock signals (CLK1 to CLK8) may have first to fourth clock frequencies (F1 to F4), respectively.

The clock signal may have a first clock frequency F1 which has 4 cycles in the time interval (T0 to T4). The second clock frequency F2 may have 8 cycles. The third clock frequency F3 may have 16 cycles. And the fourth clock frequency F4 have 32 cycles. That is, the second clock frequency F2 may be twice the first clock frequency F1. The third clock frequency F3 may be twice the second clock frequency F2. And the fourth clock frequency F4 may be twice the third clock frequency F3. The clock generator 2920 may change the clock frequency depending on the number of active blocks that are activated.

Figure 9:
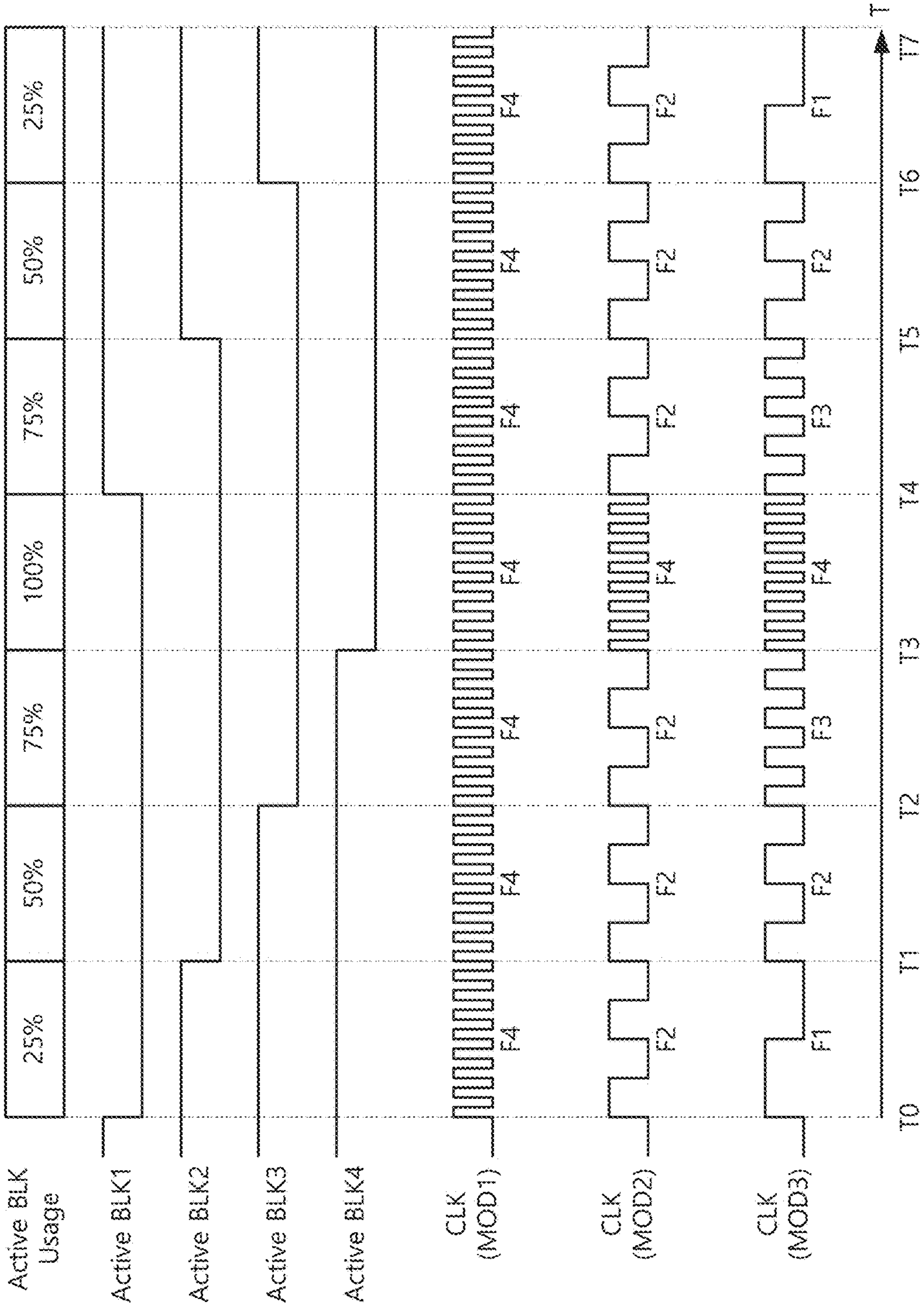
FIG. 9 is a graph illustrating example implementations showing clock frequencies that vary depending on the number of activated active blocks.

FIG. 9 is a graph illustrating example implementations showing clock frequencies that vary depending on the number of activated active blocks. Referring to FIG. 9, one or more of the first to fourth active blocks may be activated.

In the first time interval (T0 to T1), the first active block may be activated (e.g., the signal Active BLK1 signal may be low). In the second time interval (T1 to T2), the first and second active blocks may be activated (e.g., the signals Active BLK1 and Active BLK2 may be low). In the third time interval (T2 to T3), the first to third active blocks may be activated (e.g., the signals Active BLK1, Active BLK2, and Active BLK3 may be low). And in the fourth time interval (T3 to T4), the first to fourth active blocks may be activated (e.g., all four Active BLK1, Active BLK2, Active BLK3, and Active BLK4 may be low). The active block usage rate may be 25% in the first time interval (T0-T1), 50% in the second time interval (T1-T2), 75% in the third time interval (T2-T3), and 100% in the fourth time interval.

In the fifth time interval (T4 to T5), the second to fourth active blocks may be activated (e.g., the signals Active BLK2, Active BLK3, and Active BLK4 may be low). In the sixth time interval (T5 to T6), the third and fourth active blocks may be activated (e.g., the signals Active BLK3 and Active BLK4 may be low). In the seventh time interval (T6 to T7), the fourth active block may be activated (e.g., the signal Active BLK4 may be low). The active block usage rate may be 75% in the fifth time interval (T4 to T5), 50% in the sixth time interval (T5 to T6), and 25% in the seventh time interval (T6 to T7).

The pump circuit 2000 may select one of a plurality of modes and change the clock frequency of clock signals in response to the selected mode signal.

In the first mode MOD1, the clock generator 2920 may generate clock signals having the same clock frequency in all time intervals regardless of the count signal CNT. For example, the clock generator 2920 may generate clock signals having the fourth clock frequency F4 in all first to seventh time intervals. In the first mode MOD1, a clock signal having a different clock frequency (for example, F3) may be generated instead of the clock signal having the fourth clock frequency F4.

In the second mode MOD2, the clock generator 2920 may generate clock signals having one clock frequency and another clock frequency in response to the count signal CNT and the mode selection signal SEL_MOD. For example, one clock frequency may be the fourth clock frequency F4, and the other clock frequency may be a clock frequency ('not F4') other than the fourth clock frequency F4.

The clock generator 2920 may generate clock signals with a fourth clock frequency F4 in the fourth time interval (T3 to T4) and generate clock signals with a second clock frequency F2 in other time intervals. Here, 'not F4' may be the first clock frequency F1 or the third clock frequency F3 instead of the second clock frequency F2.

In the third mode MOD3, the clock generator 2920 may generate clock signals with clock frequencies that vary depending on the number of activated active blocks in response to the count signal CNT and the mode selection signal SEL_MOD. The clock generator 2920 may generate clock signals with a first clock frequency F1 when one active block is activated, and generate clock signals with a second clock frequency F2 when two active blocks are activated. And the clock generator 2920 may generate clock signals with a third clock frequency F3 when three active blocks are activated, and generate clock signals with a fourth clock frequency F4 when four active blocks are activated.

For example, the clock generator 2920 may generate clock signals having a first clock frequency F1 in the first time period (T0 to T1) and generate clock signals having a second clock frequency F2 in the second time period (T1 to T2). The clock generator 2920 may generate clock signals having a third clock frequency F3 in the third time interval (T2 to T3) and generate clock signals having a fourth clock frequency F4 in the fourth time interval (T3 to T4).

Figure 10:
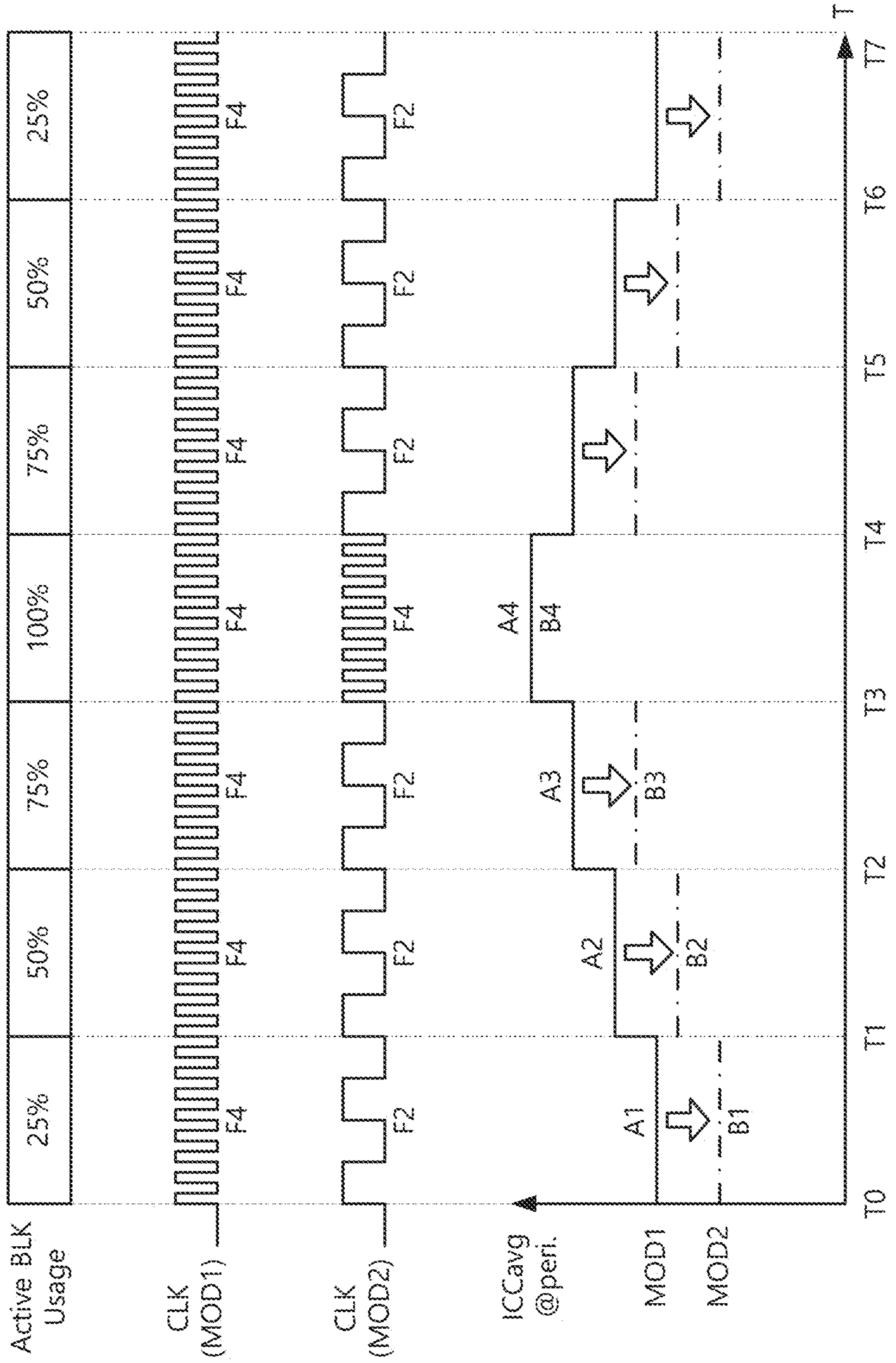
FIGS. 10 and 11 are graphs illustrating the average amount of operating current in the peripheral circuit according to mode change.
Figure 11:
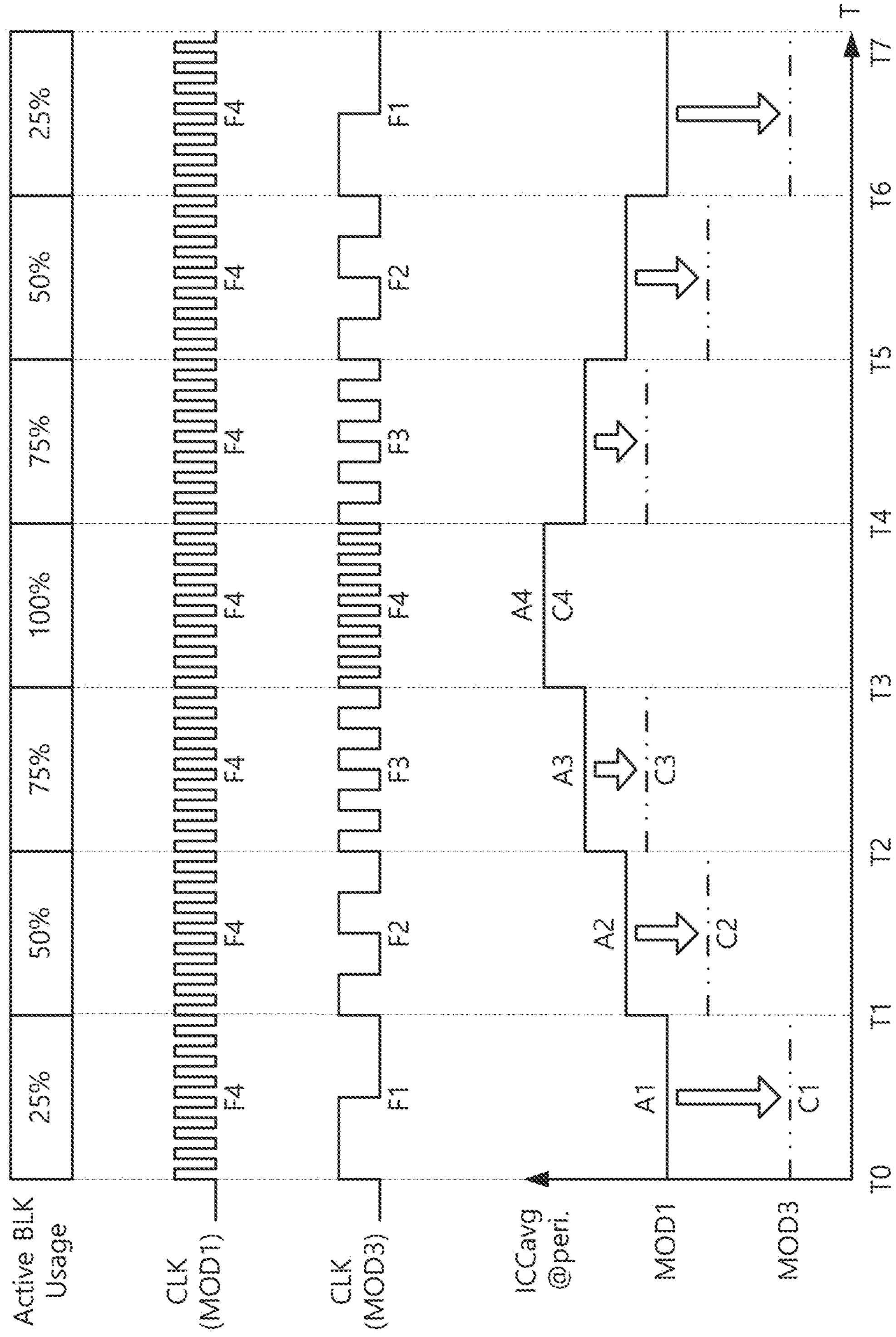

FIGS. 10 and 11 are graphs illustrating the average amount of operating current in the peripheral circuit according to mode change. FIG. 10 shows the change in average amount of operating current ICCavg when changing from the first mode MOD1 to the second mode MOD2. FIG. 11 shows the change in average amount of operating current ICCavg when changing from the first mode MOD1 to the third mode MOD3.

Referring to FIG. 10, the first active block may be activated in the first time interval (T0 to T1). The clock generator 2920 may generate clock signals with a fourth clock frequency F4 in the first mode MOD1 and generate clock signals with a second clock frequency F2 in the second mode MOD2. In the first time interval (T0 to T1), the first mode MOD1 may consume the A1 average amount of operating current in the peripheral circuit, and the second mode MOD2 may consume the B1 average amount of operating current. The difference of the average amount of operation current in the peripheral circuit in the first mode MOD1 and in the second mode MOD2 may be A1–B1.

In the second time interval (T1 to T2), the first and second active blocks may be activated. The clock generator 2920 may generate clock signals with a fourth clock frequency F4 in the first mode MOD1 and generate clock signals with a second clock frequency F2 in the second mode MOD2. In the second time interval (T1 to T2), the first mode MOD1 may consume the A2 average amount of operating current in the peripheral circuit, and the second mode MOD2 may consume the B2 average amount of operating current. The difference of the average current amount of the peripheral circuit in the first mode MOD1 and the second mode MOD2 may be A2–B2. A2–B2 may be the same as A1–B1.

In the third time interval (T2 to T3), the first to third active blocks may be activated. In the third time interval (T2 to T3), the first mode MOD1 may consume the A3 average amount of operating current in the peripheral circuit, and the second mode MOD2 may consume the B3 average amount of operating current. The difference of the average amount of operating current in the peripheral circuit in the first mode MOD1 and the second mode MOD2 may be A3–B3. A3–B3 may be the same as A1–B1 and/or A2–B2.

In the fourth time interval (T3 to T4), the first to fourth active blocks may be activated. The clock generator 2920 may generate clock signals with the fourth clock frequency F4 in the first mode MOD1 and the second mode MOD2. The first mode MOD1 may consume the A4 average amount of operating current in the peripheral circuit, and the second mode MOD2 may consume the B4 average amount of operating current. Here, A4 may be equal to B4.

Referring to FIG. 11, in the first time interval (T0 to T1), the first mode MOD1 may consume the A1 average amount of operating current in the peripheral circuit, and the third mode MOD3 may consume the C1 average amount of operating current. The difference of the average current amount of the peripheral circuit in the first mode MOD1 and the third mode MOD3 may be A1–C1. Here, A1–C1 may be greater than A1–B1. That is, when the memory device 1100 changes from the first mode MOD1 to the third mode MOD3, the average current consumption of the peripheral circuit may be further reduced.

In the second time interval (T1 to T2), the first mode MOD1 may consume the A2 average amount of operating current in the peripheral circuit, and the third mode MOD3 may consume the C2 average amount of operating current. The difference of the average current amount of the peripheral circuit in the first mode MOD1 and the third mode MOD3 may be A2–C2. Here, A2–C2 may be equal to A2–B2.

In the third time interval (T2 to T3), the first mode MOD1 may consume the A3 average amount of operating current in the peripheral circuit, and the third mode MOD3 may consume the C3 average amount of current. The average current amount difference between the peripheral circuit in the first mode MOD1 and the third mode MOD3 may be A3–C3.

In the fourth time interval (T3 to T4), the first mode MOD1 may consume the A4 average amount of operating current in the peripheral circuit, and the third mode MOD3 may consume the C4 average amount of operating current. Here, A4 may be equal to C4.

Figure 12:
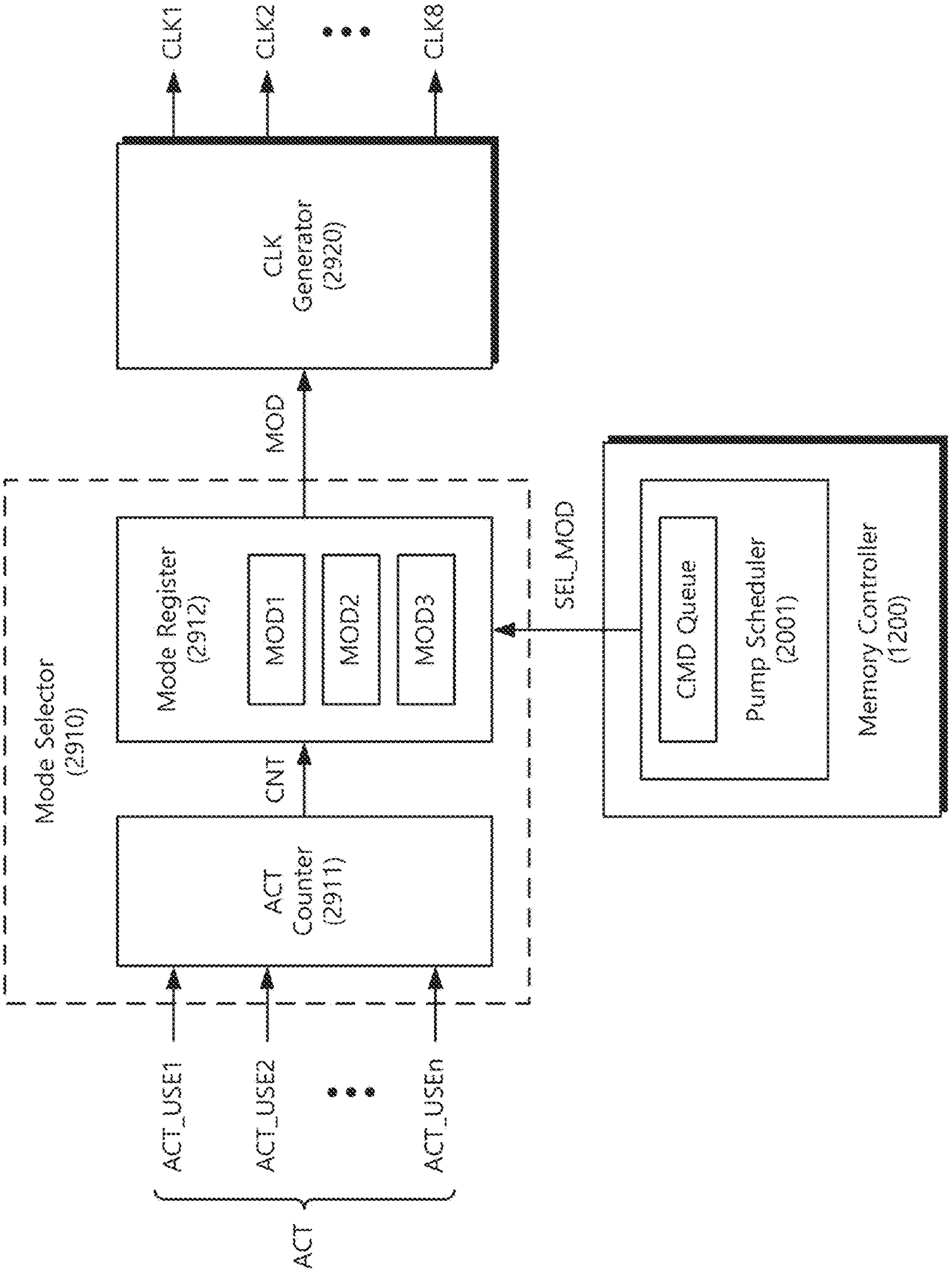
FIG. 12 is a block diagram illustrating an example implementation of a storage device according to the present disclosure.

FIG. 12 is a block diagram illustrating an example implementation of a storage device according to the present disclosure. The mode selection signal shown in FIG. 7 may be provided from a memory controller 1200. Referring to FIG. 12, the memory controller 1200 may include a pump scheduler 2001. The pump scheduler 2001 may include a command queue (CMD Queue).

The command queue may receive command requests such as program, read, erase, etc. provided from the host, and may perform queue scheduling according to the amount of available power by considering the power status of the memory device 1100. The pump scheduler 2001 may efficiently manage the power of the memory device 1100 by managing the command queue and clock frequency modes.

The mode selector 2910 may receive a mode selection signal SEL_MOD from the pump scheduler 2001. The pump scheduler 2001 may calculate the average current consumption in the peripheral circuit by considering commands such as program, read, erase, etc. stored in the command queue, and provide a mode selection signal SEL_MOD according to the calculation result.

Figure 13:
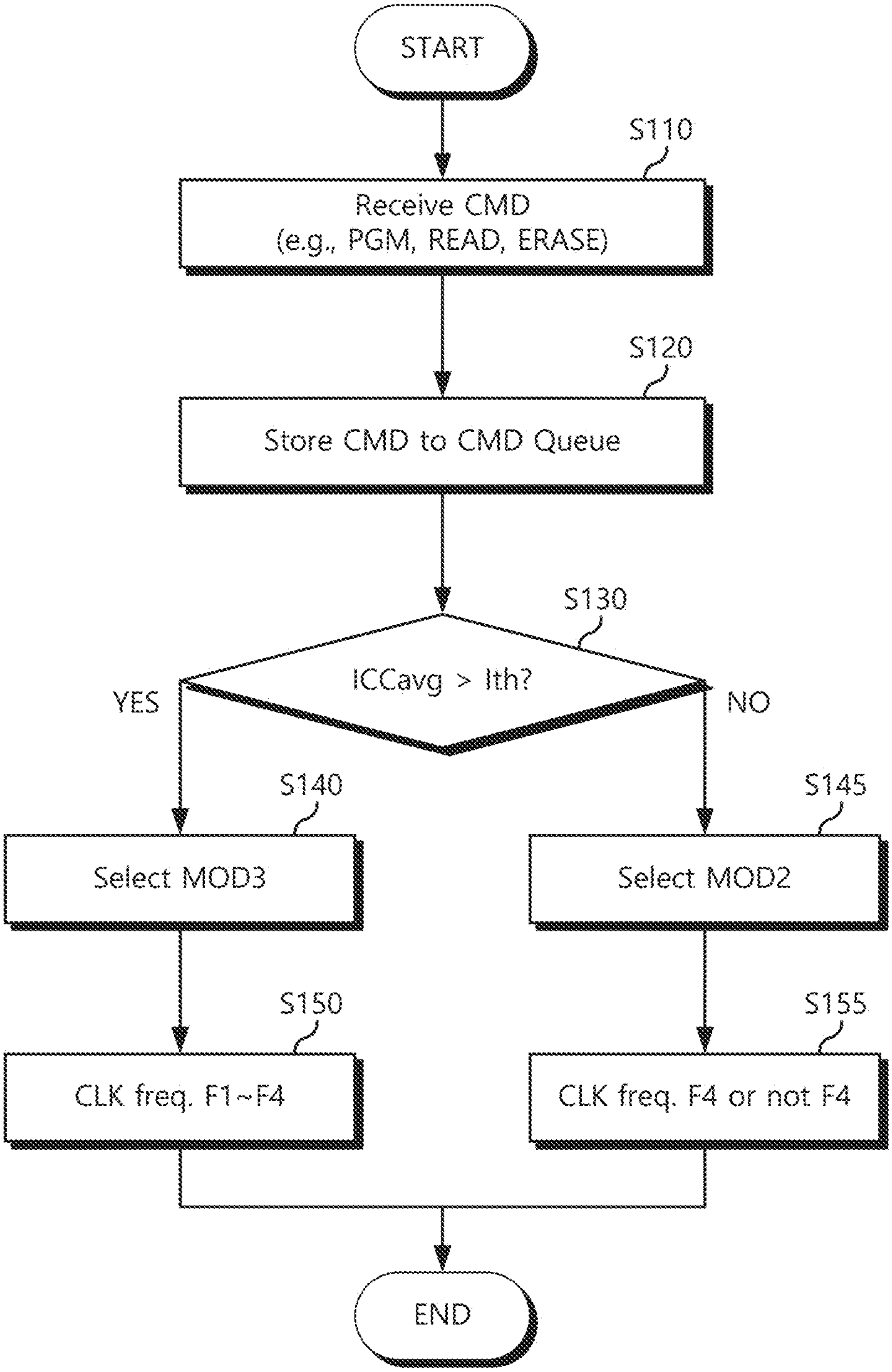
FIG. 13 is a flowchart illustrating an example implementation of operating method of the pump scheduler shown in FIG. 12.

FIG. 13 is a flowchart illustrating an example implementation of an operating method of the pump scheduler shown in FIG. 12. Referring to FIG. 13, the pump scheduler 2001 may receive commands such as program, read, and erase (S110).

The pump scheduler 2001 may store the input command in the command queue (S120). The pump scheduler 2001 may determine whether at least one command is stored in the command queue. The pump scheduler 2001 may check the depth of the command queue. The pump scheduler 2001 may store the command if the queue depth is greater than a reference. The pump scheduler 2001 may not store the command if the queue depth is not greater than the reference.

The pump scheduler 2001 may calculate the average operating current amount ICCavg of the memory device 1100 based on the command stored in the command queue and determine whether the average operating current amount ICCavg is greater than the threshold current amount Ith (S130). Here, the average operating current amount ICCavg may be the overall average operating current amount consumed in the peripheral circuit 1115 of the memory device 1100.

The pump scheduler 2001 may provide a mode selection signal SEL_MOD to select the third mode MOD3 if the average operating current ICCavg is greater than the threshold current Ith (S140). The pump scheduler 2001 may provide a mode selection signal SEL_MOD to select the second mode MOD2 if the average operating current ICCavg is less than or equal to the threshold current Ith (S145).

If the second mode MOD2 is selected, the clock generator 2920 may generate clock signals having the fourth clock frequency F4 or a clock frequency that is not the fourth clock frequency 'not F4' (S155). If the third mode MOD3 is selected, the clock generator 2920 may generate clock signals having the first to fourth clock frequencies (F1 to F4) depending on the number of active blocks to be activated. (S150)

The memory device 1100 according to implementations of the present disclosure may change the operating mode of the clock frequency according to the number of active blocks to be activated. The memory device 1100 may reduce the average current consumption of peripheral circuit 1115. The memory device 1100 according to implementations of the present disclosure may also be applied to active blocks having a vertical structure. For example, it may also be applied when the memory device 1100 has a multi-stack structure, a COP structure, or a C2C structure.

Figure 14:
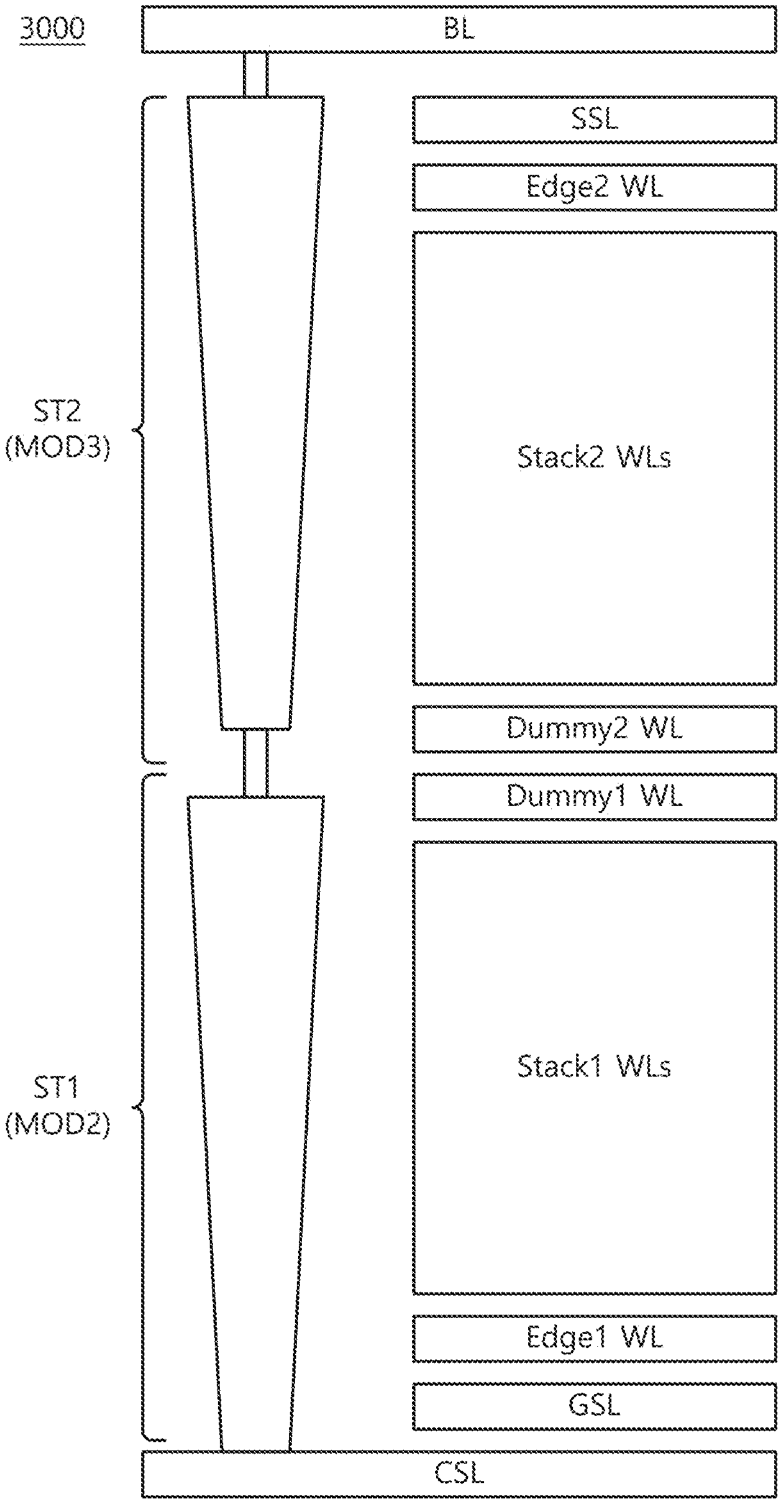
FIG. 14 is a diagram illustrating an example implementation of a flash memory having a multi-stack structure.

FIG. 14 is a diagram illustrating an example implementation of a flash memory having a multi-stack structure. Referring to FIG. 14, the flash memory 3000 may have a first stack ST1 and a second stack ST2. The first stack ST1 may be located at the bottom, and the second stack ST2 may be located at the top.

A pillar of the flash memory 3000 may be formed by bonding the first and second stacks ST1 and ST2. A plurality of dummy word lines (e.g., Dummy1 WL and Dummy2 WL) may be included at junctions of the first and second stacks ST1 and ST2. The first stack ST1 may be positioned between the common source line CSL and the first dummy word line Dummy1 WL. The second stack ST2 may be positioned between the second dummy word line Dummy2 WL and the bit line BL.

The first stack ST1 may include a ground selection line GSL, a first edge word line Edge1 WL, and first stack word lines Stack1 WLs. The second stack ST2 may include second stack word lines Stack2 WLs and second edge word lines Edge2 WL. Memory cells connected to the first and second edge word lines Edge1 WL and Edge2 WL may store bit data differently from the other memory cells. For example, memory cells connected to the first and second edge word lines Edge1 WL and Edge2 WL may be single-level cells (SLC) or multi-level cells (MLC), and memory cells connected to the other word lines may be triple-level cells (TLC) or quad-level cells (QLC).

The flash memory 3000 may perform independent memory operations for each active block. During independent memory operation, the flash memory 3000 may control clock frequency operation modes differently depending on the height of the word line. For example, the flash memory 3000 may be controlled to operate in the second mode MOD2 in the first stack ST1 and in the third mode MOD3 in the second stack ST2.

Figure 15:
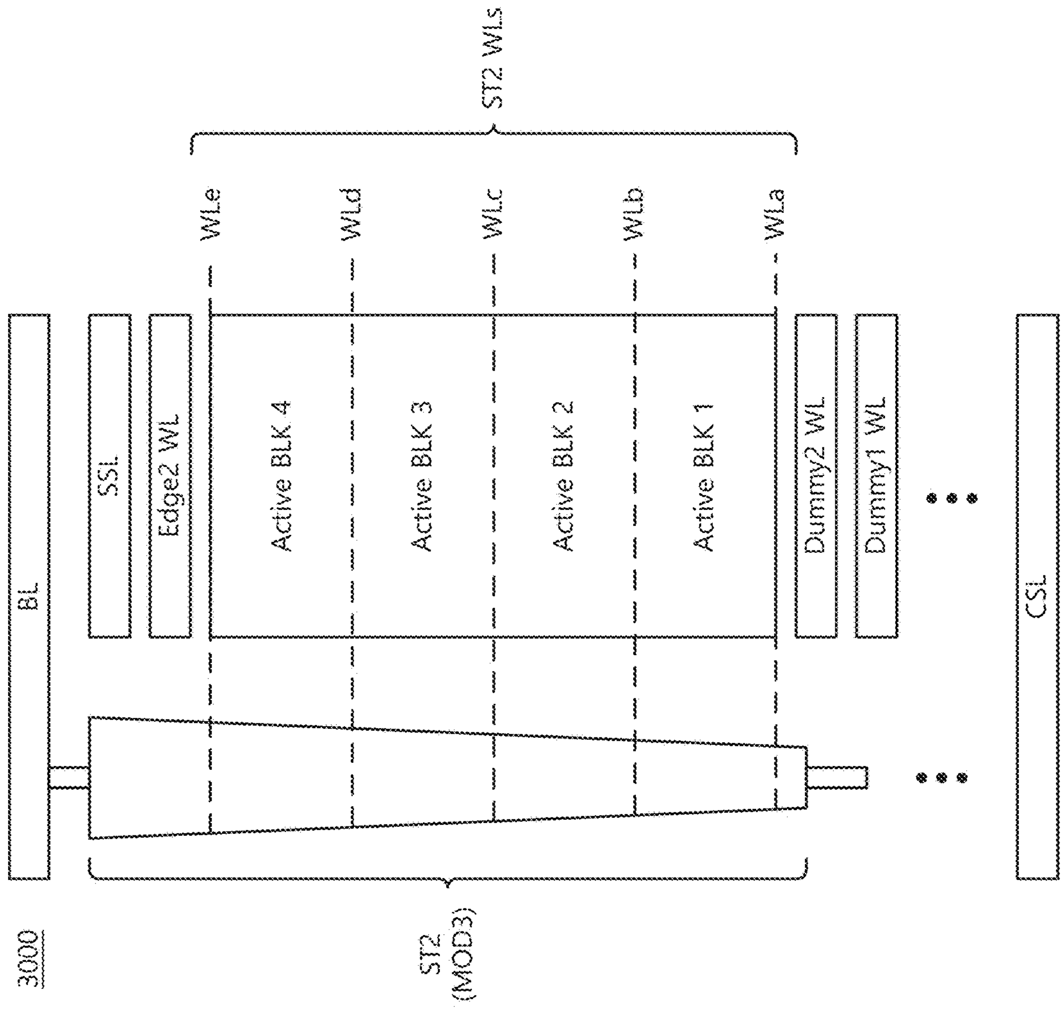
FIGS. 15 and 16 are conceptual diagrams illustrating an example implementation of operation in a third mode in the second stack of a flash memory having a multi-stack structure shown in FIG. 14.
Figure 16:
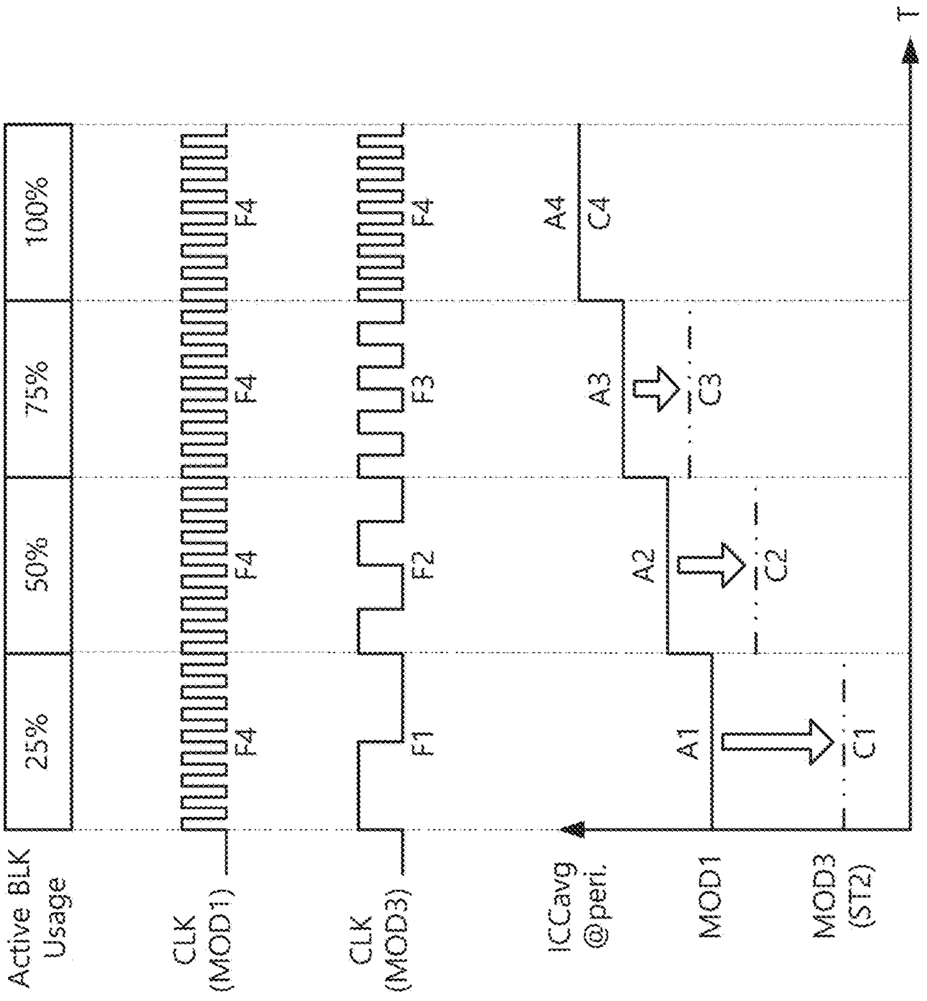

FIGS. 15 and 16 are conceptual diagrams illustrating an example implementation of operation in a third mode in the second stack of a flash memory having a multi-stack structure shown in FIG. 14.

Referring to FIG. 15, the flash memory 3000 may divide the second stack ST2 into four active blocks that operate at the same clock frequency. For example, the first active block is a group of memory cells between WLa and WLb and may operate at the same clock frequency. The second active block is a group of memory cells between WLb and WLc and may operate at the same clock frequency. The third active block is a group of memory cells between WLc and WLd and may operate at the same clock frequency. The fourth active block is a group of memory cells between WLd and WLe and may operate at the same clock frequency.

Referring to FIG. 16, one active block is activated in the second stack ST2 in the first time interval (T0 to T1). Since the second stack ST2 operates in the third mode MOD3, it may consume the C1 average amount of operating current. The difference in the average current amount of the peripheral circuit in the first mode MOD1 and the third mode MOD3 may be A1−C1.

In the second time interval (T1 to T2), two active blocks in the second stack ST2 are activated. The second stack ST2 may consume the C2 average amount of operating current. The difference in average current amount of peripheral circuit in the first mode MOD1 and the third mode MOD3 may be A2−C2.

In the third time interval (T2 to T3), three active blocks of the second stack ST2 are activated. The second stack ST2 may consume the C3 average amount of operating current. The difference in average current amount of peripheral circuit in the first mode MOD1 and the third mode MOD3 may be A3−C3.

In the fourth time interval (T3 to T4), four active blocks of the second stack ST2 are activated. The second stack ST2 may consume the C4 average amount of operating current in the third mode MOD3. The first mode MOD1 may consume the A4 average amount of operating current in the peripheral circuit. Here, A4 may be equal to C4.

Figure 17:
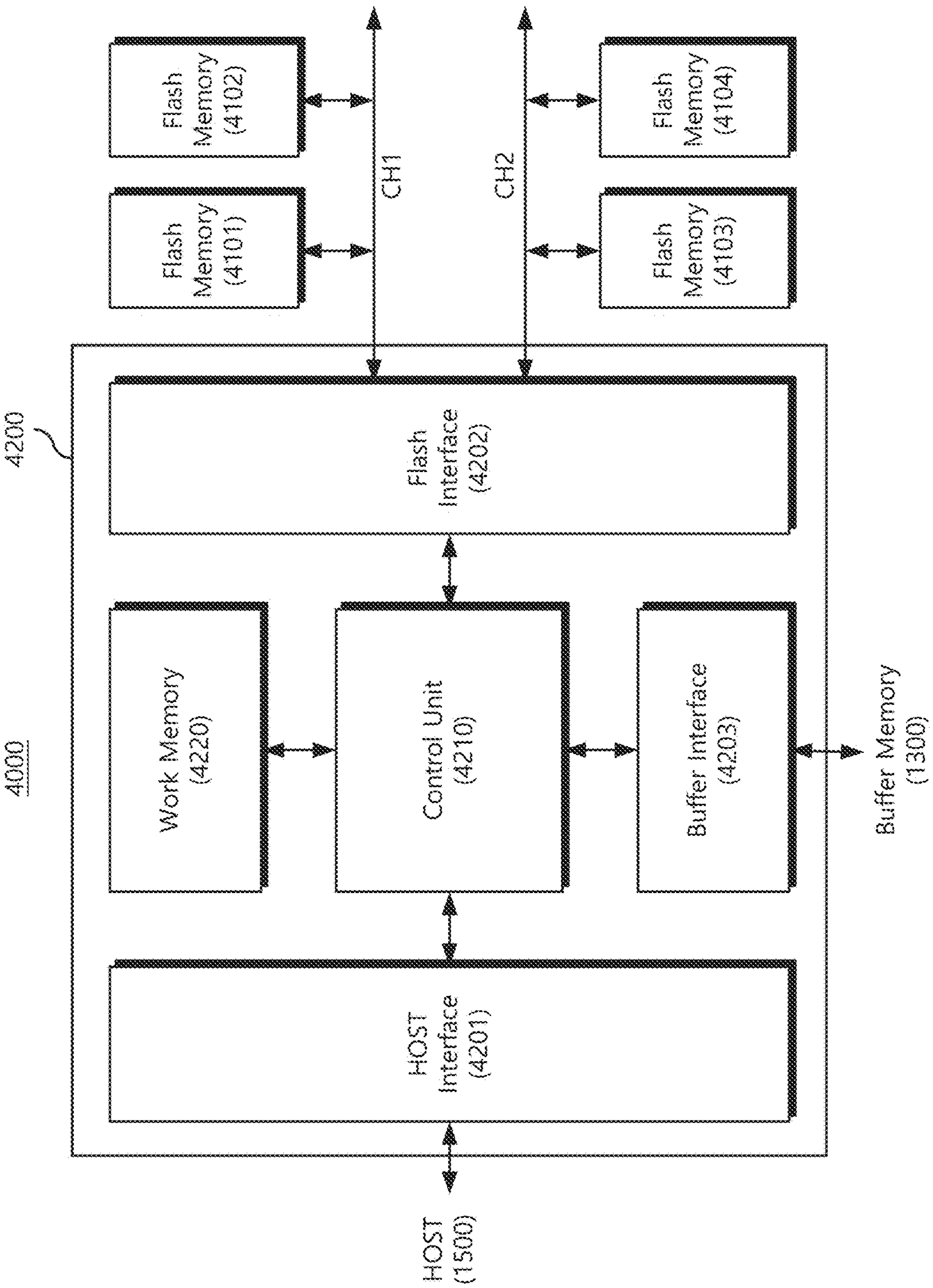
FIG. 17 is a block diagram illustrating an example in which a storage device according to an example implementation of the present disclosure is implemented with a solid state drive (SSD).

FIG. 17 is a block diagram illustrating an example in which a storage device according to implementations of the present disclosure is implemented with a solid state drive (SSD). Referring to FIG. 17, an SSD 4000 may include a plurality of flash memories 4101 to 4104 and an SSD controller 4200.

The first and second flash memories 4101 and 4102 may be connected with the SSD controller 4200 through a first channel CH1. The third and fourth flash memories 4103 and 4104 may be connected with the SSD controller 4200 through a second channel CH2. The number of channels connected with the SSD controller 4200 may be 2 or more. The number of flash memories connected with one channel may be 2 or more.

The SSD controller 4200 may include a host interface 4201, a flash interface 4202, a buffer interface 4203, a control unit 4210, and a work memory 4220. The SSD controller 4200 may be connected with a host 1500 through the host interface 4201. Depending on a request of the host 1500, the SSD controller 4200 may write data in the corresponding flash memory or may read data from the corresponding flash memory.

The SSD controller 4200 may be connected with the plurality of flash memories 4101 to 4104 through the flash interface 4202 and may be connected with a buffer memory 1300 through the buffer interface 4203. The flash interface 4202 may provide data, which are temporarily stored in the buffer memory 1300, to the flash memories through the channels CH1 and CH2. The flash interface 4202 may transfer the data read from the flash memories 4101 to 4104 to the buffer memory 1300.

The control unit 4210 may analyze and process the signal received from the host 1500. The control unit 4210 may control the host 1500 or the flash memories 4101 to 4104 through the host interface 4201 or the flash interface 4202. The control unit 4210 may control operations of the flash memories 4101 to 4104 by using firmware for driving the SSD 4000.

The SSD controller 4200 may manage data to be stored in the flash memories 4101 to 4104. In a sudden power-off event, the SSD controller 4200 may back up the data stored in the work memory 4220 or the buffer memory 1300 to the flash memories 4101 to 4104.

According to the present disclosure, it may be possible to efficiently use the operating current of the memory device and reduce current consumption by varying the clock frequency according to the number of active blocks to be activated.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

While the present disclosure has been described with reference to implementations thereof, it will be apparent to those of ordinary skill in the art that various changes and modifications may be made thereto without departing from the spirit and scope of the present disclosure as set forth in the following claims.

What is claimed is:

1. A memory device comprising:

a memory cell array having a plurality of active blocks, each of the plurality of active blocks including a plurality of memory cells being configured to operate at a clock frequency;

a voltage generator configured to provide an operating voltage to the plurality of memory cells; and a control logic configured to control an independent memory operation for each of the plurality of active blocks, wherein the voltage generator includes a pump circuit configured to change the clock frequency and generate the operating voltage according to a number of active blocks activated during the independent memory operation, wherein the pump circuit comprises a mode selector and a clock generator, wherein the mode selector is configured to receive an active block use signal and a mode selection signal from the control logic and select one of a plurality of modes, wherein clock generator is configured to change the clock frequency in response to a mode signal selected by the mode selector, wherein the mode selector comprises an active block counter and a mode register, wherein the active block counter is configured to receive the active block use signal and calculate the number of active blocks, and wherein the mode register is configured to store the plurality of modes, receive a signal of the number of active blocks of the active block counter, receive the mode selection signal, and provide one of the plurality of modes to the clock generator.

2. The memory device of claim 1, wherein the independent memory operation is a read operation or a program operation independently performed between activated active blocks.

3. The memory device of claim 1, wherein the independent memory operation is an erase operation performed independently between activated active blocks.

4. The memory device of claim 1, wherein the plurality of active blocks are mats, and each of the mats includes a plurality of memory cells being configured to operate at the clock frequency.

5. The memory device of claim 1, wherein the mode register is configured to store:

a first mode for generating clock signals having the clock frequency;

a second mode for generating clock signals having a first clock frequency and a second clock frequency being different from the first clock frequency; and a third mode for generating clock signals, wherein the clock frequency varies depending on the number of active blocks.

6. The memory device of claim 1, wherein the mode selection signal is provided from a pump scheduler of a memory controller.

7. The memory device of claim 6, wherein the pump scheduler is configured to store commands input to a command queue, and wherein the memory device is configured to calculate an amount of operating current required by a peripheral circuit of the memory device based on commands stored in the command queue.

8. The memory device of claim 6,
wherein the pump scheduler is configured to compare an operating current amount and a threshold current amount, and to provide a mode selection signal for selecting one of the plurality of modes to the mode selector according to a result of the comparison.

9. A memory device comprising:
a first stack in which first memory cells are stacked in a direction perpendicular to a substrate; and
a second stack in which second memory cells are stacked on the first stack in the direction perpendicular to the substrate,
wherein the first memory cells and the second memory cells are divided into a plurality of active blocks, each active block being configured to operate at a selected clock frequency of a plurality of clock frequencies,
wherein the memory device is configured to perform independent memory operations for each active block, and to change the selected clock frequency for performing the independent memory operations according to a number of active blocks activated during the independent memory operations,
wherein the memory device comprises a mode selector, a clock generator, an active block counter, and a mode register,
wherein the mode selector is configured to receive an active block use signal and a mode selection signal and select one of a plurality of modes,
wherein the clock generator is configured to change the selected clock frequency in response to a mode signal selected by the mode selector,
wherein the active block counter is configured to receive the active block use signal and calculate the number of active blocks, and
wherein the mode register is configured to
store the plurality of modes,
receive a signal of the number of active blocks of the active block counter,
receive the mode selection signal, and
provide one of the plurality of modes to the clock generator.

10. The memory device of claim 9,
wherein the independent memory operations comprise a read operation or a program operation independently performed between activated active blocks.

11. The memory device of claim 9,
wherein the independent memory operations comprise an erase operation performed independently between activated active blocks.

12. The memory device of claim 9, further comprising:
a pump circuit comprising the mode selector configured to receive a mode selection signal, to select one of a plurality of modes, and to change the selected clock frequency in response to the selected mode signal.

13. The memory device of claim 12,
wherein the mode selection signal is provided from a memory controller.

14. An operating method of a memory device which includes a memory cell array having a plurality of active blocks, each active block including a plurality of memory cells; a voltage generator configured to provide an operating voltage to the plurality of memory cells; and a control logic configured to control independent memory operations for each active block, the method comprising:
counting a number of active blocks activated during a selected independent memory operation of the independent memory operations;
changing frequencies of clock signals for generating the operating voltage according to the counted number of active blocks;
providing clock signals with changed frequencies to the voltage generator; and
receiving an active block use signal and a mode selection signal to select one of a plurality of modes,
wherein in changing the frequencies of clock signals, the frequencies of clock signals are changed in response to the selected mode signal, and
wherein the plurality of modes includes
a first mode for generating clock signals having a selected clock frequency,
a second mode for generating clock signals having a first clock frequency and a second clock frequency different from the first clock frequency, and
a third mode for generating clock signals with clock frequencies that vary depending on the counted number of active blocks.

15. The method of claim 14,
wherein the selected independent memory operation is a read operation or a program operation independently performed between activated active blocks.

16. The method of claim 14,
wherein the mode selection signal is generated within the memory device or provided from a memory controller.

* * * * *